US008254502B2

(12) United States Patent
Sambhwani et al.

(10) Patent No.: US 8,254,502 B2
(45) Date of Patent: Aug. 28, 2012

(54) POST DECODING SOFT INTERFERENCE CANCELLATION

(75) Inventors: Sharad D. Sambhwani, San Diego, CA (US); Wei Zeng, San Diego, CA (US); Wei Zhang, San Diego, CA (US); Jan K Wegrzyn, San Diego, CA (US); Mehraban Iraninejad, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 562 days.

(21) Appl. No.: 12/487,117

(22) Filed: Jun. 18, 2009

(65) Prior Publication Data

US 2010/0158161 A1    Jun. 24, 2010

Related U.S. Application Data

(60) Provisional application No. 61/140,061, filed on Dec. 22, 2008, provisional application No. 61/140,536, filed on Dec. 23, 2008, provisional application No. 61/145,054, filed on Jan. 15, 2009.

(51) Int. Cl.
*H04L 27/06* (2006.01)

(52) U.S. Cl. ........ 375/341; 375/260; 375/262; 375/340; 375/346; 455/63.1; 455/67.13; 455/114.2; 455/296; 455/501; 714/755; 714/758; 714/794; 714/795; 714/796; 370/335; 370/342; 329/349; 329/353; 341/173; 341/180; 327/551

(58) Field of Classification Search .......... 375/260, 375/262, 340, 341, 346; 455/63.1, 67.13, 455/114.2, 296, 501; 714/755, 758, 794, 714/795, 796; 370/335, 342; 329/349, 353; 341/173, 180; 327/551
See application file for complete search history.

(56) References Cited

U.S. PATENT DOCUMENTS

| 6,904,109 | B1 * | 6/2005 | Hottinen ................. 375/346 |
| 7,266,143 | B2 * | 9/2007 | Vihriala ................. 375/148 |
| 7,415,001 | B2 | 8/2008 | Naguleswaran et al. |
| 2003/0095590 | A1 * | 5/2003 | Fuller et al. ............ 375/148 |
| 2005/0174983 | A1 | 8/2005 | Naguleswaran et al. |
| 2007/0206664 | A1 * | 9/2007 | Grant .................... 375/148 |

FOREIGN PATENT DOCUMENTS

| EP | 1353451 A1 | 10/2003 |
| GB | 2403104 | 12/2004 |
| WO | WO9611534 A2 | 4/1996 |

OTHER PUBLICATIONS

International Search Report and Written Opinion—PCT/US2009/067910, International Searching Authority—European Patent Office, May 28, 2010.
Partial International Search Report—PCT/US2009/067910, International Searching Authority—European Patent Office, Apr. 1, 2010.
Rose Y. Shao., et al., "Two Simple Stopping Criteria for Turbo Decoding" IEEE Transactions on Communications, IEEE Service Center, Piscataway, NJ, US, vol. 47, No. 8, Aug. 1, 1999, XP011009477 abstract.

* cited by examiner

*Primary Examiner* — Leon Flores
(74) *Attorney, Agent, or Firm* — Larry Moskowitz; Darren M. Simon

(57) ABSTRACT

The present patent application discloses a method and apparatus for decoding, comprising decoding signals iteratively, mutually exchanging extrinsic information, calculating APP LLRs for both systematic and parity bits and making a hard decision after a plurality of iterations is completed based on accumulated soft information. The present patent application also discloses a method and apparatus for post decoding soft interference canceling, comprising generating updated a posteriori probabilities for systematic and parity bits from a turbo decoder, mapping the posteriori probabilities to soft symbols, quantizing the soft symbols, re-encoding a data packet, filtering a chip sequence, reconstructing an interference waveform, and scaling reconstruction filter coefficients using the symbols.

19 Claims, 21 Drawing Sheets

Block diagram of Post decoding
(Hard/Soft IC)

Figure 2: Block diagram of Post decoding (Hard/Soft IC)

Figure 3: 3GPP Turbo Encoder

Figure 4: Existing 3GPP Turbo Decoder

Figure 5: Modification to 3GPP Turbo decoder to output soft APP for systematic and parity bits Figure 6 MMSE symbol estimator using APP LLR Figure 7 Block diagram of post-decoding IC using MMSE Symbol Estimator Figure 8 Hard Symbol Detector Figure 9 Block diagram of post-decoding IC using hard symbol detector Figure 10: Erasure Detector Figure 11: Block diagram of post-decoding IC using Erasure detector Figure 12: Block diagram of post-decoding IC using average reliability

Figure 13: Optimal Soft IC: Cancel multiple H-ARQ transmissions per user

Figure 14: Reduced Complexity Soft IC: Cancel latest H-ARQ transmission only

POST DECODING SOFT INTERFERENCE CANCELLATION

CROSS-REFERENCE TO RELATED APPLICATION

This application claims the benefit under 35 U.S.C. 119 of Provisional Application Ser. No. 61/140,061, Post decoding soft interference cancellation, filed Dec. 22, 2008, Provisional Application Ser. No. 61/140,536, Post decoding soft interference cancellation, filed Dec. 23, 2008, and Provisional Application Ser. No. 61/145,054, Post decoding soft interference cancellation: algorithm and system performance, filed Jan. 15, 2009.

FIELD OF THE INVENTION

The present application pertains to interference cancellation and decoding data.

BACKGROUND

Universal Mobile Telecommunications System (UMTS) is one of the third-generation (3G) mobile telephone technologies (or 3rd Generation Wireless Mobile Communication Technology). A UMTS network consists of 1) a core network (CN), 2) a UMTS terrestrial radio access network (UTRAN) and 3) user equipment (UE). The core network provides routing, switching, and transit for user traffic. A Global System for Mobile Communications (GSM) network with General Packet Radio Service (GPRS) is the basic core network architecture that UMTS is based on. The UTRAN provides the air interface access method for User Equipment. A base station is referred to as Node B and control equipment for Node Bs is called a radio network controller (RNC). For an air interface, UMTS most commonly uses a wideband spread-spectrum mobile air interface known as wideband code division multiple access (or W-CDMA). W-CDMA uses a direct sequence code division multiple access signaling method (or CDMA) to separate users.

A UMTS Terrestrial Radio Access Network (UTRAN) is a collective term for the Node Bs (or base stations) and the control equipment for the Node Bs (or radio network controllers (RNC)) it contains which make up the UMTS radio access network. This is a 3G communications network which can carry both real-time circuit switched and IP based packet switched traffic types. The RNC provides control functionalities for one or more Node Bs. Connectivity is provided between the UE (user equipment) and the core network by the UTRAN.

The UTRAN is connected internally or externally to other functional entities by four interfaces: Iu, Uu, Iub and Iur. The UTRAN is attached to a GSM core network via an external interface called Iu. A radio network controller (RNC) supports this interface. In addition, the RNC manages a set of base stations called Node Bs through interfaces labeled Iub. The Iur interface connects two RNCs with each other. The UTRAN is largely autonomous from the core network since the RNCs are interconnected by the Iur interface. FIG. 1 discloses a communication system which uses the RNC, the Node Bs and the Iu and Uu interfaces. The Uu is also external and connects the Node B with the UE, while the Iub is an internal interface connecting the RNC with the Node B.

The RNC fills multiple roles. First, it may control the admission of new mobiles or services attempting to use the Node B. Second, from the Node B, i.e. base station, point of view, the RNC is a controlling RNC. Controlling admission ensures that mobiles are allocated radio resources (bandwidth and signal/noise ratio) up to what the network has available. It is where Node B's Iub interface terminates. From the UE, i.e. mobile, point of view, the RNC acts as a serving RNC in which it terminates the mobile's link layer communications. From the core network point of view, the serving RNC terminates the Iu for the UE. The serving RNC also controls the admission of new mobiles or services attempting to use the core network over its Iu interface.

In the UMTS system, universal terrestrial radio access (UTRA) frequency division duplex (FDD) channels and UTRA time division duplex (TDD) channels may be used to communicate data. The communication link through which the user equipment sends signals to the Node B is called an uplink. Applying interference cancellation in Node Bs will allow them to receive transmissions at higher data rates, i.e., interference cancellation can increase data rates on the uplink. It can also increase capacity on the uplink.

The apparatuses and methods of the present patent application is directed to overcoming limitations of the prior art and providing improved interference cancellation.

SUMMARY OF THE INVENTION

In view of the above, the described features of the present invention generally relate to one or more improved systems, methods and/or apparatuses for an improved receiver with interference cancellation.

In a first embodiment, the present patent application comprises a method and apparatus for canceling interference, comprising demodulating a data packet, decoding the data packet, generating updated a posteriori probabilities for systematic and parity bits, mapping said a posteriori probabilities to symbols, re-encoding said data packet using the quantized symbols, whereby a chip sequence is produced, and filtering the chip sequence.

In another embodiment, the method and apparatus further comprise an apparatus for storing a latest reconstructed signal of each packet that has not yet been successfully decoded, computing a difference between the latest reconstructed signal and a previous reconstructed signal, and subtracting the difference between said latest reconstructed signal and a previous reconstructed signal from a sample input signal, wherein the demodulating a data packet comprises demodulating a received sample input signal and the latest reconstructed interference signal.

In another embodiment, the present patent application comprises a method and apparatus for post-decoding soft interference cancellation, comprising a traffic data demodulator unit, wherein a received signal is demodulated, a turbo decoder, wherein a posteriori probabilities for systematic and parity bits are generated, a processor, wherein it is determined whether a data packet was successfully decoded, a symbol estimator operably connected to said turbo decoder, wherein said a posteriori probabilities are mapped to symbols, a data re-encoder operably connected to said symbol estimator, wherein decoded data is re-encoded to recover a chip sequence, and a traffic interference filtering and accumulation block operably connected to said data re-encoder, wherein a chip sequence is filtered and an interference waveform is reconstructed using the re-encoded chip sequence.

In another embodiment, the apparatus further comprises a reconstructed signal buffer having an input operably connected to an output of said interference filtering and accumulation unit, wherein a latest reconstructed signal of each packet that has not yet been successfully decoded is stored, a summer, having a first input operably connected to an output of the reconstructed signal buffer, a second input operably connected to an output of the interference filtering and accumulation unit and at least one output operably connected to an input of the interference subtraction unit, wherein a difference between the latest reconstructed signal and the previous reconstructed signal are computed, and wherein the difference between said latest reconstructed signal and the previous reconstructed signal is subtracted from the samples in the modified antenna sample buffer in the interference subtraction unit and wherein the traffic data demodulator unit demodulates a received signal from the sample input buffer and the reconstructed interference signal.

In another embodiment, the present patent application comprises a method and apparatus for post decoding soft interference cancellation, comprising a turbo decoder, wherein updated a posteriori probabilities for bits are generated, a symbol estimator operably connected to said turbo decoder, wherein said a posteriori probabilities are mapped to symbols, a rate matching and interleaving block operably connected to said symbol estimator, wherein the data packet is re-encoded, a respreader operably connected to said rate matching and interleaving block, a traffic interference filtering and accumulation block operably connected to said respreader, wherein a chip sequence is filtered and an interference waveform is then reconstructed using the re-encoded chip sequence in the interference filtering unit, a pilot and overhead demodulater and decoder, a traffic-to-pilot scale unit operably connected to said pilot and overhead demodulater and decoder, and a filter setup unit operably connected to said traffic interference filtering and accumulation block and said traffic-to-pilot scale unit, wherein reconstruction filter coefficients of said interference filter are scaled using the symbols from said symbol estimator and output of said traffic-to-pilot scale unit.

In another embodiment, the present patent application comprises a method and apparatus for post decoding soft interference canceling, comprising generating updated a posteriori probabilities for systematic and parity bits from a turbo decoder, mapping the a posteriori probabilities to symbols, re-encoding the data packet using the quantized soft symbols, whereby a chip sequence is produced, filtering the chip sequence, reconstructing an interference waveform using the chip sequence, and scaling reconstruction filter coefficients using the symbols.

In another embodiment, the present patent application comprises a method and apparatus for decoding, comprising decoding signals iteratively, mutually exchanging extrinsic information, and making a hard decision after a plurality of iterations is completed based on accumulated soft information. In another embodiment, the apparatus and method further comprises multiplexing a first APP LLR for parity bits, a second APP LLR for the parity bits and the APP LLR for the systematic bits output; and producing an APP LLR for both the systematic and said parity bits.

In another embodiment, the present patent application comprises a turbo decoder, comprising at least two concatenated decoders, wherein each of the at least two decoders comprises a processor, memory in electronic communication with the processor; and instructions stored in the memory, the instructions being executable by the processor to run iteratively and mutually exchange extrinsic information.

In another embodiment, the turbo decoder further comprises a multiplexer 1480 having a plurality of inputs and at least one output, wherein a first of the plurality of inputs of the multiplexer is operably connected to a second output of the second decoder, wherein a second of the plurality of inputs of said multiplexer is operably connected to an output of the second deinterleaver; and wherein a third of the plurality of inputs of the multiplexer is operably connected to a second output of the first decoder, wherein the first APP LLR for the parity bit from the first decoder and the second APP LLR for the parity bit from the second decoder are multiplexed in the multiplexer with the APP LLR for the systematic bits output from deinterleaver to produce an APP LLR for both systematic and parity bits.

Further scope of the applicability of the present method and apparatus will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The features, objects, and advantages of the presently disclosed method and apparatus will become more apparent from the detailed description set forth below when taken in conjunction with the drawings in which like reference characters identify correspondingly throughout and wherein.

DETAILED DESCRIPTION

Figure 1:
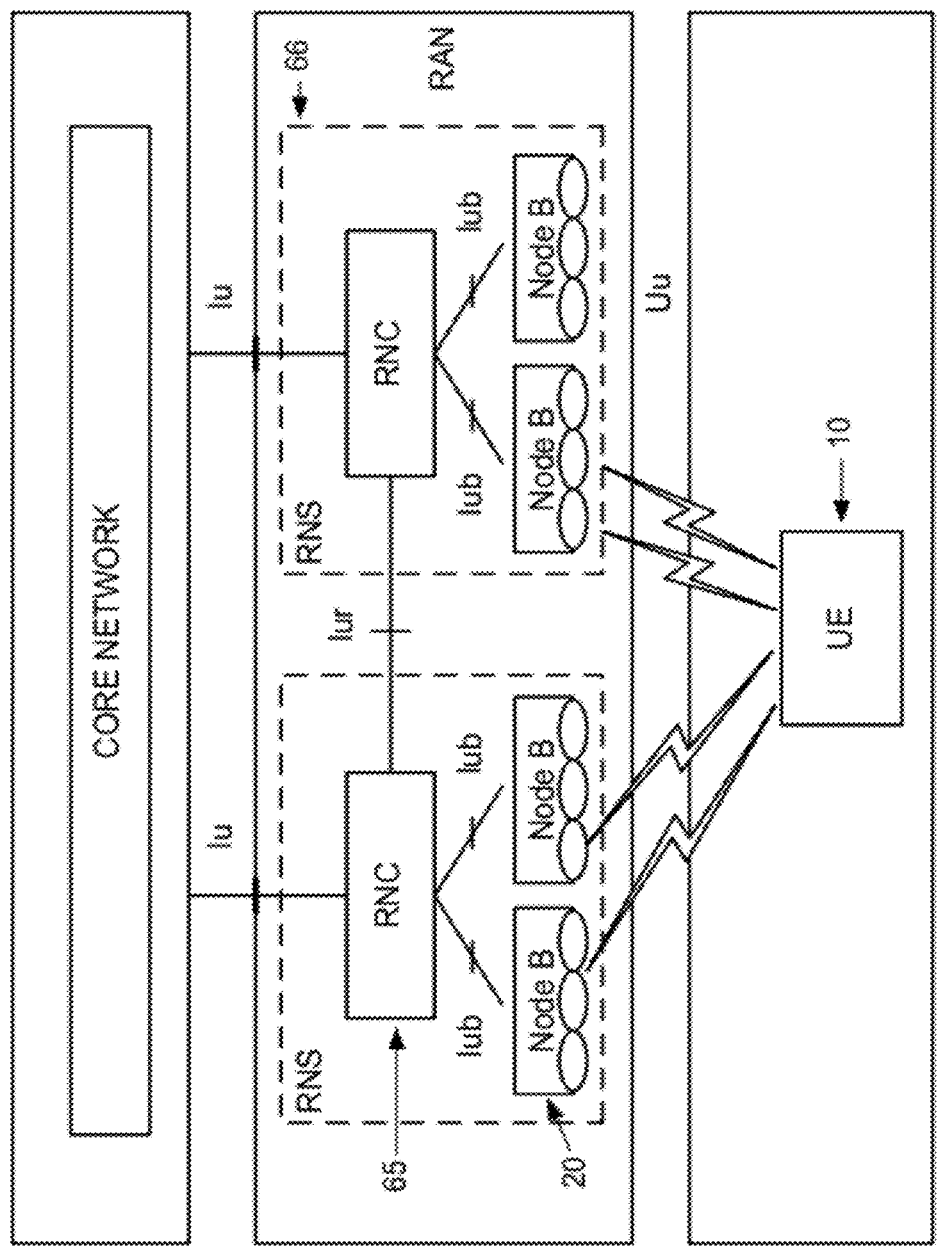
FIG. 1 is a block diagram of a radio access system having two radio network subsystems along with its interfaces to the core and the user equipment.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well known structures and devices are shown in block diagram form in order to avoid obscuring the concepts of the present invention.

Post Decoding Soft Interference Cancellation

Interference cancellation is used to cancel other users' signals before a data decision of the desired user's signal. In a WCDMA system, canceling a successfully decode user's signal reduces the interference seen during the demodulation of subsequent users and thus improves their chances of being decoded successfully. The interference cancellation may be hard or soft. Soft interference cancellation refers to estimating what the other users' signals or data values are and using those estimates to cancel interference from them. In one example, minimum mean square error (MMSE) estimates of the data symbols may be derived from the soft output of the channel decoder to reconstruct the waveform. A hard detector is one that outputs a hard decision as a function of the input. Most often this would be a binary accept/reject decision. Soft detectors output a real number, in the form of a log-likelihood-ratio. This is the logarithm of the ratio between the likelihood that the target produced the input, and the likelihood that a non-target produced the input. The likelihood-ratio output can theoretically be used to make optimal decisions for any given target prior and any costs associated with making erroneous decisions.

In one example, during the uplink interference cancellation (IC), a method and apparatus has been used for post decoding hard traffic IC conditioned on the fact that the user signal was decoded successfully. In another example, a soft IC (for example parallel IC) method and apparatus has been used wherein the method still attempts to cancel the interfering user's symbols even if it fails to decode the interfering user's symbols. In parallel IC, decoding for multiple users is carried out simultaneously to reduce the processing delay.

The complexity of post decoding hard traffic IC increases when supporting a fully loaded Voice over Internet Protocol (VoIP). That is, a VoIP system increases the complexity of post decoding hard traffic IC. VoIP is a general term for a family of transmission technologies for delivery of voice communications over the Internet). The present method and apparatus uses soft traffic IC method on top of already existing hard traffic IC method to cancel interference. To optimize the IC architecture, both Best Effort (BE) traffic scenarios or a mixture of BE and low rate R99 voice users are used. In these examples, there may be a smaller number of users to support compared to the VoIP case. Under such scenarios, supporting soft traffic IC method on top of already existing hard traffic IC methods may become quite feasible.

The present patent application discloses a novel post decoding soft IC method that can be accommodated with minor changes to the already existing post decoding hard IC method.

Figure 2:
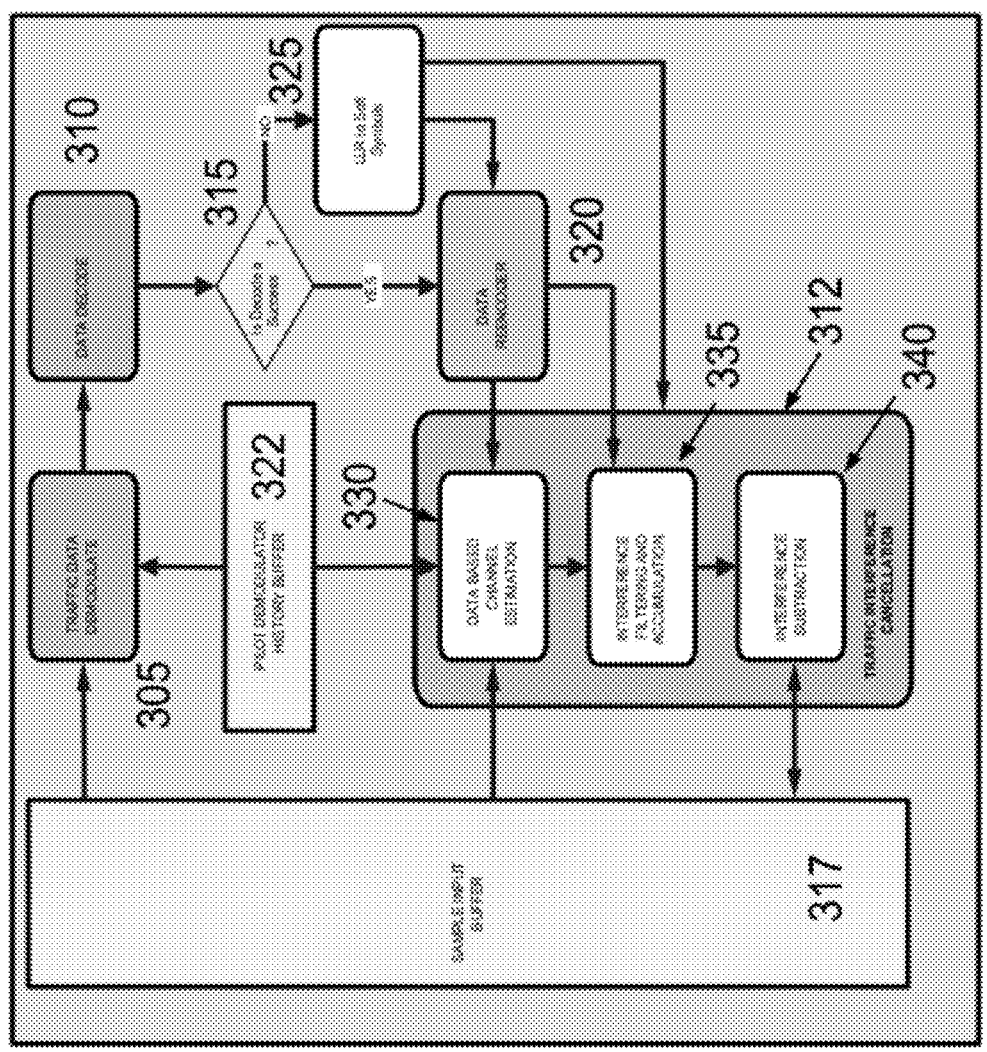
FIG. 2 is a block diagram of post decoding (hard/soft interference cancellation)

The post decoding soft IC method is best illustrated in FIG. 2 which reuses all the blocks from the post decoding hard IC method with the following modifications/additions:

Generate updated a posteriori probabilities (APP) for systematic and parity bits from the turbo decoder.

Convert APP to soft symbols using the minimum mean-squared error (MMSE) criteria.

Quantize the soft symbols in a symbol estimator 325 and feed the hard bits to the rate matching and interleaving blocks 355. The output of these blocks 355 feed directly to the traffic interference filtering and accumulation block 335, i.e. the data-based channel estimator (DBCE) unit 310 does not perform channel estimation using these bits.

Average the soft symbols and feed forward the soft values directly to the traffic interference filtering and accumulation block 335.

Figure 15:
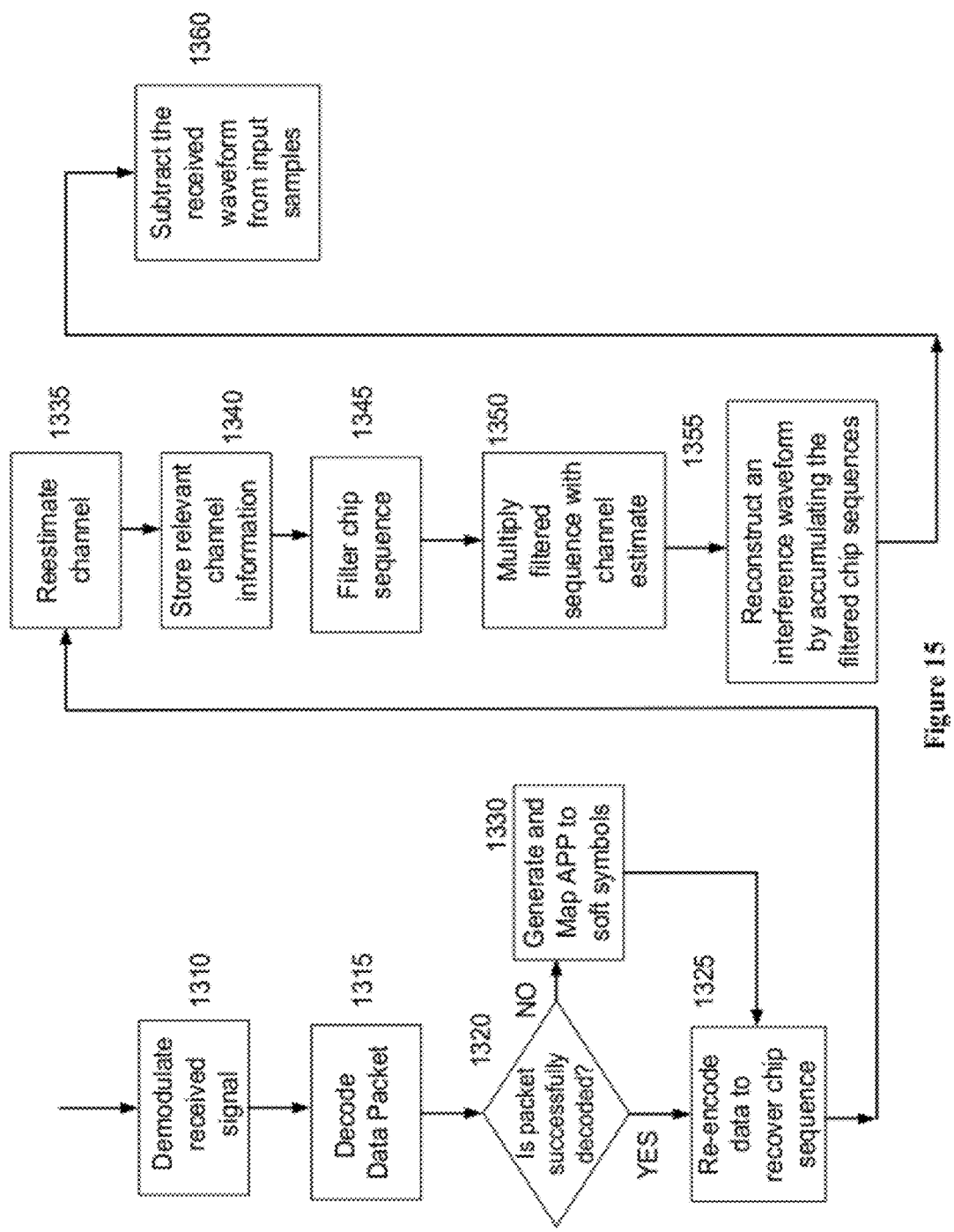
FIG. 15 is a flowchart of the steps taken using the post decoding (hard/soft interference cancellation) apparatus of FIG. 2.

As seen in FIG. 2, the traffic data demodulator (TDD) unit 305 performs demodulation (step 1310 of FIG. 15) on the received signal from the sample input buffer 317. Next, the data packet is sent to the data decoder 310 to decode the data packet (step 1315). Together, the traffic demodulator 305 and the traffic data decoder 310 execute timing synchronization, descrambling, despreading, phase rotation and maximal ratio combining (MRC). In the next step, a processor 315 decides "Is the data packet successfully decoded (step 1320)? If the answer is YES, then the data packet is re-encoded by the data re-encoder 320 (step 1325). If the answer is NO, then the APP is generated and mapped (step 1330) to soft symbols in a symbol estimator 325. That is, the symbol estimator 325 converts the LLR to soft symbols if the answer is NO. The soft symbols are then fed to the data re-encoder 320. For the purpose of reconstructing the waveform for cancellation, the decoded data is re-encoded to recover the chip sequence. Once a data packet is successfully re-encoded by the data re-encoder 320, the data packet from the data re-encoder 320 is fed to the data based channel estimation (DBCE) unit 330 in the traffic interference cancellation (TIC) unit 312 where it is used as a pilot to re-estimate the channel (step 1335). The TIC unit 312 works on the re-encoded data chips after successful decoding. The traffic interference cancellation unit 312 comprises the data based channel estimation (DBCE) unit 330, the traffic interference filtering and accumulation unit 335 and the traffic interference subtraction unit 340.

The pilot demodulator history buffer 322 stores relevant channel estimate information (step 1340). The output of the pilot demodulator history buffer 322 is also fed to the DBCE unit 330. High quality of channel estimation is useful when cancelling interference. If the channel estimate is inaccurate, a large residual interference will remain in the signal because the reconstructed signal will not match the true interference. The decoded data can be better used to improve channel estimation performance in the case of high traffic to pilot power ratios, which is referred to as data based channel estimation.

The data packet from the data re-encoder 320 is also fed to the interference filtering and accumulation unit 335. The output of the data based channel estimation (DBCE) unit 330 is also fed to the interference filtering and accumulation unit 335. The interference waveform is then reconstructed using the new channel estimates and the re-encoded chip sequence in the interference filtering and accumulation unit 335. This interference waveform synthesis is implemented by first filtering the chip sequence, i.e., interference filtering (step 1345). The filtering reconstructs the received waveform samples. Next, the filter outputs are multiplied with the channel estimate (step 1350). Finally, multiple paths are accumulated together to reconstruct the composite interference waveform (step 1355). In one example, the DBCE unit 330 may be optional. The DBCE may be bypassed by scaling the channel estimate information from the pilot demodulator history buffer 322.

Finally, the interference waveform is subtracted from the waveform buffer (or samples from the received sample input buffer 317) in the interference subtraction unit 340 (step 1360). The sample input buffer 317 is a real time buffer which is continuously updated with cancelled waveforms from the traffic interference cancellation unit (TIC) 312. It is noted that these subsystems are executed in a pipelined manner to accelerate the processing.

In a WCDMA system, canceling a successfully decoded user, reduces the interference seen during the demodulation of subsequent users and thus improves their chances of being decoded successfully. However, interference cancellation for WCDMA uses the storage of pervious transmissions of the user equipments (UEs) 10. This may lead to a large onboard storage requirement which may be prohibitive on some platforms which may not have enough memory to store all the previous attempts. For example, as a user might not decode in the first attempt, all retransmissions may be stored to reattempt this user once other successful users have been cancelled. A large memory buffer may store up to 4 transmissions for 2 ms transmission time interval (TTI) enhanced users and 2 transmissions for 10 ms TTI enhanced users. (The transmission time interval (TTI) is the time interval for which the modulation, coding and spreading format is fixed). Additionally, dedicated 10 ms, 20 ms and 40 ms users may be supported by the method and apparatus disclosed in the present patent application. The present patent application will work with many different buffer sizes. In one example, the sample input buffer 317 may be a modified antenna sample buffer (MASB). If all the memory used for storing prior transmissions may not be stored in a field programmable gate array (FPGA), the data may be stored in an external memory and TTI users may be processed out of an on board (internal) cache. An example of external low bandwidth memory is quad data rate II (QDRII) memory.

Encoder

Figure 3:
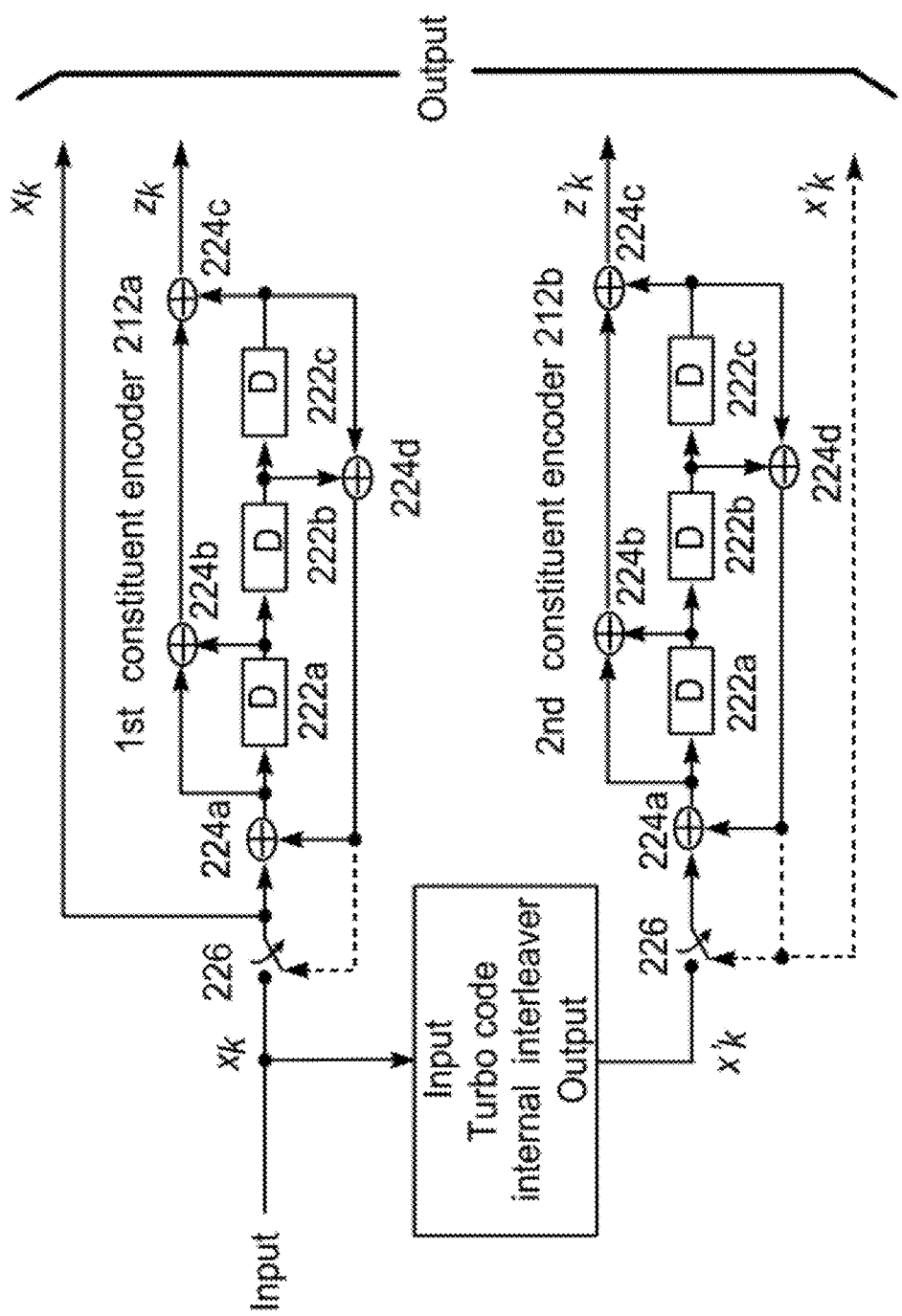
FIG. 3 illustrates a 3GPP turbo encoder.
Figure 4:
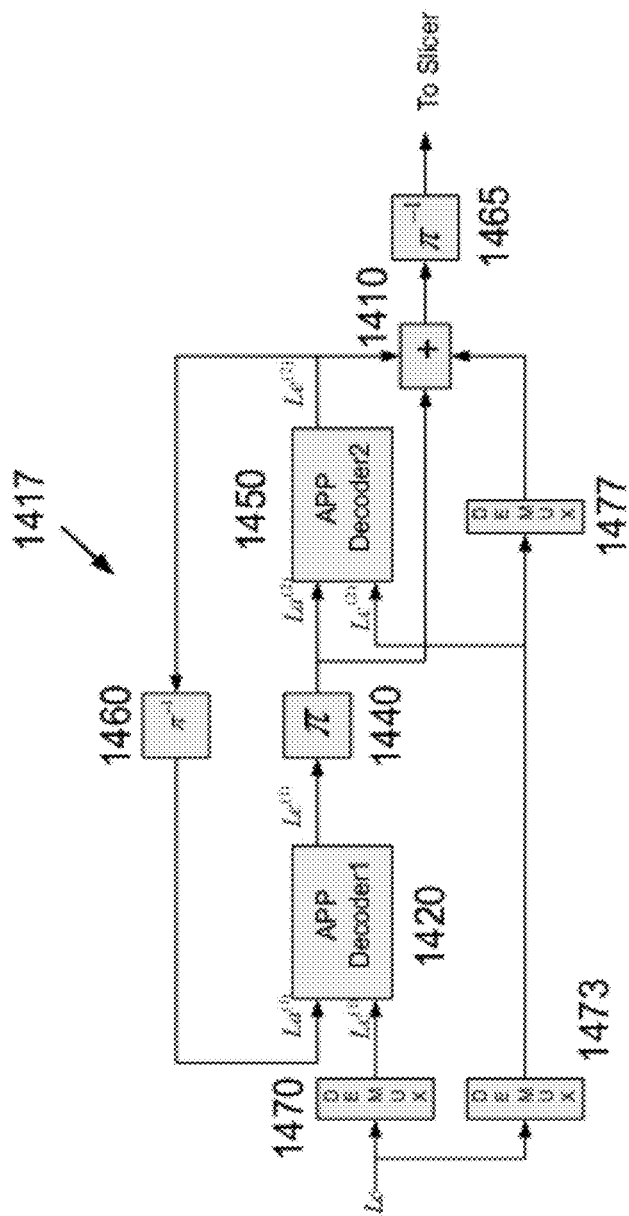
FIG. 4 illustrates a 3GPP turbo decoder.

FIG. 3 illustrates a 3GPP turbo encoder. FIG. 4 illustrates a 3GPP turbo decoder. Turbo coding is a forward error correction (FEC) method which adds redundancy to an input signal to provide error protection. A 3GPP turbo encoder consists of a parallel concatenation of two identical RSC (Recursive Systematic Convolutional) encoders. An encoder accepts k information symbols and appends separately a set of r redundant symbols (parity bits) derived from the information symbols. Note that the information word is not disturbed in any way in the encoder. An interleaver separates the two encoders.

The interleaver de-correlates the inputs to the two RSCs by reordering the input bits to the second RSC. The code interleaver shuffles (i.e., interleaves) the information bits in the code segment in accordance with a defined interleaving method. As a result of the interleaving, it is unlikely that the encoded bits from both RSCs have low weight code words at the same time. Also, it helps the encoded bits to cope with bursty noise.

The first RSC encoder 212a encodes the info word X of length K and the second RSC encoder 212b encodes the interleaved info word. One constituent encoder 212a encodes the information bits in the code segment to generate a first sequence of parity bits, and the other constituent encoder 212b encodes the shuffled information bits to generate a second sequence of parity bits. Thus, each constituent encoder 212 receives either linear-order or interleaved information bits, encodes the received information bits with a defined constituent code, and provides a sequence of parity bits.

As shown in the example of FIG. 3, each constituent encoder 212 includes three series-coupled delay elements 222, four modulo-2 adders 224, and a switch 226. Initially, the states of delay elements 222 are set to zeros and switch 226 is in the up position. Then, (referring to encoder 212a) for each information bit in the code segment, adder 224a performs modulo-2 addition of the information bit x with the output bit from adder 224d and provides the result to delay element 222a. Modulo-2 addition effectively XORs the information bit x with the output bit from adder 224d. Adders 224b and 224c receive and perform modulo-2 addition of the bits from adder 224a and delay elements 222a and 222c, and provide the parity bit zk. xk is the tail systematic bits for the first constituent decoder 212a. The tail systematic bits are used to drive all the delay elements in the encoders 212a to a zero state at the end of encoding. Adder 224d performs modulo-2 addition of the bits from delay elements 222b and 222c.

After all $N_B$ information bits in the code segment have been encoded, switch 226 is moved to the up position and three zero ("0") tail bits are provided to constituent encoder 212a. First constituent encoder 212a then encodes the three tail bits and provides six tail parity bits. z'k is the parity bit and x'k is the tail systematic bits for the second constituent decoder 212b For each segment of $N_B$ information bits, first constituent encoder 212a provides $N_B$ parity bits and the first six tail parity bits $y^1$, and second constituent encoder 212b provides $N_B$ parity bits and the first six tail parity bits $y^2$.

Decoder

As illustrated in FIG. 4, with Turbo decoding, two component codes on different interleaved versions of the same information sequence are generated. Turbo decoding is typically performed for a number of iterations (e.g., 12, 16, 20, or possibly more) by the first and second constituent decoders before declaring a decoded segment. With iterative decoding, decoded output is feed back to the input of a decoder. Therefore, the output of an iterative decoder is a soft decision signal (e.g., 0.7982, −0.6452, . . . ), not a hard-decision signal like a high or low signal (e.g., +1, −1). With each iteration by a constituent decoder, the confidence in the received information bits may increase and asymptotically reach a final value. A Turbo decoder may employ checks during the decoding process to terminate the decoding if the LLRs for the bits in the code segment exceed a particular threshold value. Alternatively, the Turbo decoder may use a built-in error detecting function or metric (e.g., CRC check) to determine whether decoding has been successful and can be terminated before reaching the maximum number of allowed iterations.

Figure 16:
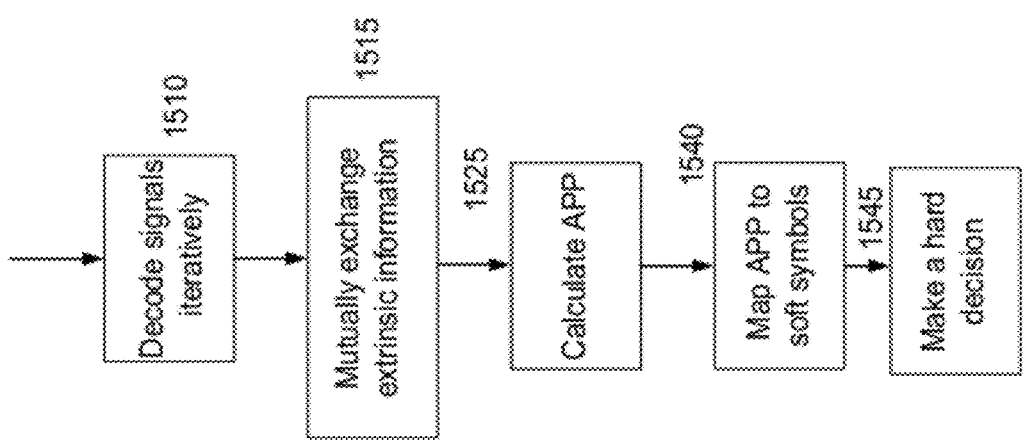
FIG. 16 is a flowchart of steps taken using 3GPP decoder to output soft APP for both systematic and parity bits of FIG. 5.

As shown in FIG. 4, the turbo decoder 1417 consists of two concatenated APP decoder blocks 1420, 1450. The two APP decoder blocks 1420, 1450 decode signals in an iterative method (see step 1510 of FIG. 16) and mutually exchange extrinsic information. A component decoder 1420, 1450 of an iterative decoder 1417 may decode a signal in many ways. In one example, the decoders 1420, 1450 may be Maximum Aposteriori Probability (MAP) decoders. Based on the received data and parity information, the MAP decoder computes the probability of the encoder being in a particular state.

The MAP decoding method produces reliable decisions by using soft signal values in the form of received data and parity symbols (which correspond to parity bits computed from actual and interleaved versions of data bits) and other decoder soft output (extrinsic) information. In turbo decoding, the MAP decoder 1420, 1450 determines the most likely information bit that has been transmitted by calculating an a posteriori probabilities (APPs) value for each transmitted data bit (step 1525) and then decoding the data bit by assigning a decision value that corresponds to the maximum a posteriori probability. (step 1540) The MAP decoder 1420, 1450 uses APPs to minimize the bit error probability (BER) by calculating the LLR for every transmitted bit $c_n$. The log likelihood ratio (LLR) is the logarithm of the probability and is used to reduce computations. Depending on the weight, parity value and soft data from previous states, the probability that the data is a '1' or '0', i.e., a hard decision, can be computed after a number of iterations is completed (step 1545). The probabilities are computed iteratively to obtain a reliable result.

Each component decoder 1420, 1450 calculates APP LLRs (log likelihood ratios), $L_{app}^{(s)}[i]$, for systematic (or information) bits, $$L_{app}^{(s)}[i] = \log\frac{Pr\{b_i = 0 \mid r\}}{Pr\{b_i = 1 \mid r\}}, i = 1, 2, \ldots, N \quad (1)$$

The log likelihood ratio is the probability that the received data bit is a '0' divided by the probability that the received data bit is a '1'. For example, equation (1) illustrates that the LLR of an input bit b at time i is the logarithm of the ratio of the probability of the bit being a zero ("0") given the received sequence r over the probability of the bit being a one ("1"). the probabilities, $Pr(b_i=0|r)$ and $Pr(b_i=1|r)$, for each input bit are based on the soft value for that bit and the sequence of bits received for the code segment being decoded. The APP LLR consists of Channel LLR, $L_c^{(s)}[i]$, Apriori LLR, $L_a^{(s)}[i]$, and Extrinsic LLR, $L_e^{(s)}[i]$ $$L_{app}^{(s)}[i] = L_c^{(s)}[i] + L_a^{(s)}[i] + L_e^{(s)}[i] \quad (2)$$

$$L_e^{(s)}[i] = \log\frac{\sum_{(s,s')\in U^0} \exp(\alpha[i,s] + P(s,s')L_c^{(p)}[i]/2 + \beta[i,s'])}{\sum_{(s,s')\in U^1} \exp(\alpha[i,s] + P(s,s')L_c^{(p)}[i]/2 + \beta[i,s'])}, \quad (3)$$

where $L_{app}^{(s)}[i]$ is the APP LLR for the systematic bit i, (s,s') is any valid state transition from state s to state s', P(s,s') is the parity bit associated with the state transition, $U^0$ is the set of all state transitions caused by systematic bit 0; $U^1$ is vice versa.

Figure 17:
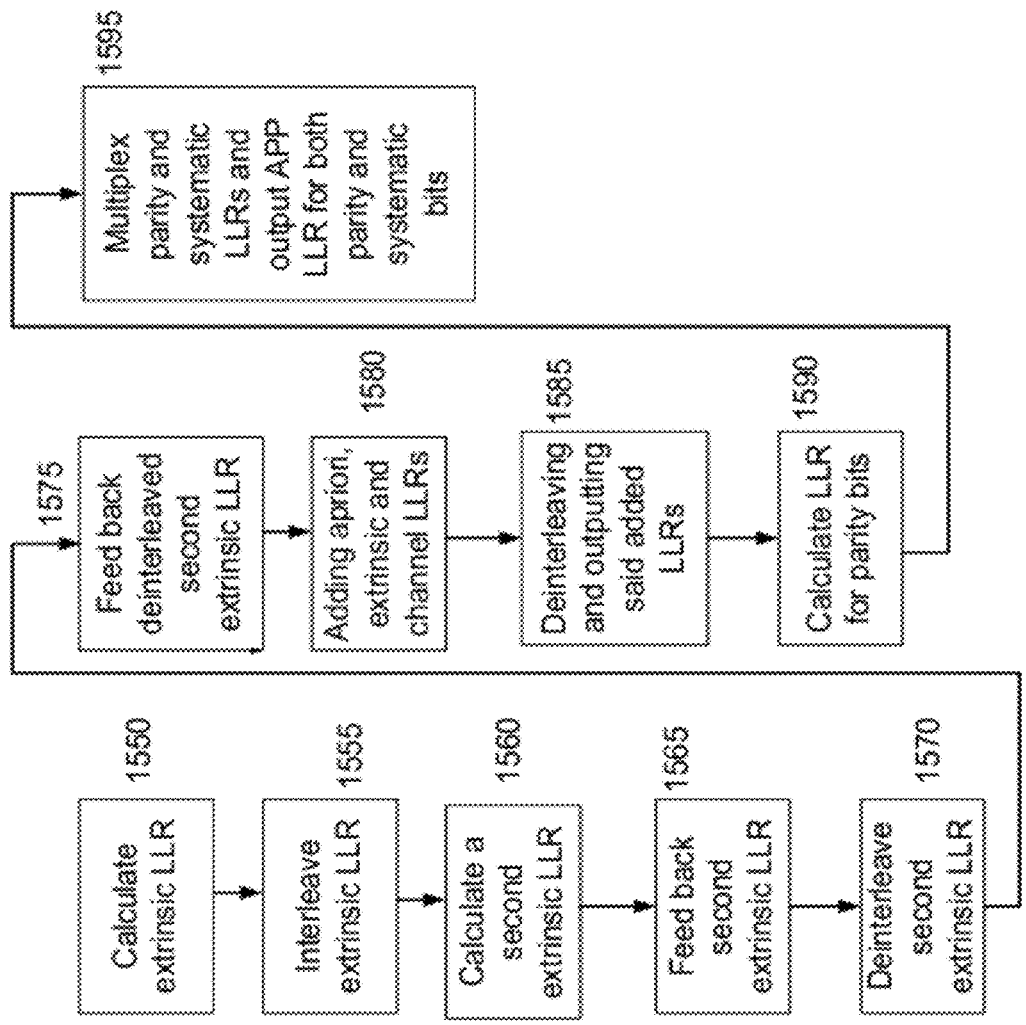
FIG. 17 is a flowchart of steps taken using a 3GPP decoder to output soft APP for both systematic and parity bits of FIG. 5.

The first demultiplexer (DEMUX) 1470 converts the channel LLR for systematic bits $L_c$ into channel LLR for the first decoder, decoder 1 1420 $L_c^{(1)}$ which is input to the first decoder 1420. The second demultiplexer (DEMUX) 1473 converts the channel LLR $L_c$ for systematic bits into channel LLR for the second decoder, decoder 2 1450 $L_c^{(2)}$ which is input to the second decoder 1450 and input into the third demultiplexer 1477. The channel LLR for the second decoder 1420 $L_c^{(2)}$ is also input to adder 1410 through the third demultiplexer 1477. The third demultiplexer 1477 extracts the channel LLRs for the systematic bits which are input to adder 1410. The first decoder 1420 uses the channel LLR $L_c^{(1)}$ and the apriori LLR $L_a^{(1)}$ to calculate the extrinsic LLR, $L_e^{(1)}[i]$ (see step 1550 of FIG. 17). The extrinsic LLR, $L_e^{(1)}[i]$ is input to interleaver 1440.

Input to the first decoder 1420 is channel LLR $L_c^{(1)}$. The first decoder 1420 uses channel LLR $L_c^{(1)}$ and channel apriori LLR $L_a^{(1)}$ in accordance with a MAP method to calculate extrinsic LLR $L_e^{(1)}$. The extrinsic LLR $L_e^{(1)}$ is generated from channel LLR $L_c^{(1)}$ and channel apriori LLR $L_a^{(1)}$ using equations (2) and (3).

The extrinsic information for systematic (or information) bits are exchanged between component decoders 1420, 1450. Equation (4) illustrates that the output of first decoder 1420, where extrinsic LLR $L_e^{(1)}$, is fed to interleaver 1440 which then outputs apriori LLR $L_a^{(2)}$ to the second decoder 1450. (step 1555) Also input to second decoder 1450 is channel LLR $L_c^{(2)}$. The second decoder 1450 uses channel LLR $L_c^{(2)}$ and channel apriori LLR $L_a^{(2)}$ in accordance with a MAP method to calculate extrinsic LLR $L_e^{(2)}$ (step 1560) which is fed back to deinterleaver 1460 (step 1565) where it is deinterleaved (step 1570) and then fed back to the first decoder 1420 as the apriori LLR $L_a^{(1)}$ (step 1575). The extrinsic LLR $L_e^{(2)}$ is generated from channel LLR $L_c^{(2)}$ and channel apriori LLR $L_a^{(2)}$ using equations (2) and (3).

$$L_e^{(1)} \to \pi(\cdot) \to L_a^{(2)} \quad (4)$$

Equation (5) illustrates that the second decoder 1450 outputs extrinsic LLR $L_e^{(2)}$ to a deinterleaver 1460 (and also to an adder 1410). Deinterleaver 1460 reorders the bits of the signal to their original positions by deinterleaving the output of the second decoder 1450 using a deinterleaving method complementary to the interleaving scheme used for interleaver 1440. Deinterleaver 1460 then feeds back apriori LLR $L_a^{(1)}$ to first decoder 1420 and to adder 1410.

$$L_e^{(2)} \to \pi^{-1}(\cdot) \to L_a^{(1)} \quad (5)$$

where $\hat{u}[i] = \begin{cases} 0 & L_{app}^{(s)}[i] > 0 \\ 1 & L_{app}^{(s)}[i] < 0, \end{cases}$ Hard decisions are made after several iterations according to APP LLRs of systematic bits.

Adder 1410 adds the apriori LLR $L_a^{(2)}$ from deinterleaver 1460, the extrinsic LLR $L_e^{(2)}$ from the second decoder 1450 and the channel LLR $L_c^{(2)}$ from the second decoder 1450 (step 1580). The output of adder 1410 is input to deinterleaver 1465. Deinterleaver 1460 deinterleaves and outputs the LLR for the systematic bit (step 1585).

Figure 5:
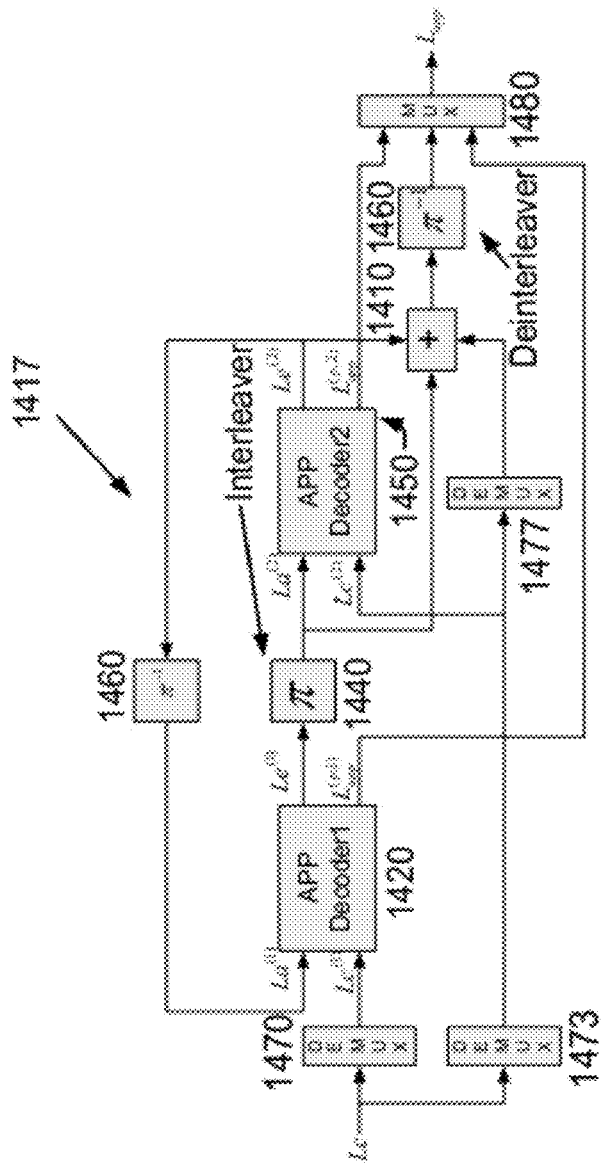
FIG. 5 illustrates the improvements to a 3GPP decoder to output soft APP for both systematic and parity bits.

In FIG. 5, to assist the soft interference cancellation, APP LLR for parity bits are also calculated $$L_{app}^{(p)}[i] = L_c^{(p)}[i] + L_e^{(p)}[i] \quad (6)$$

$$L_e^{(p)}[i] = \log\frac{\sum_{(s,s')\in P^0} \exp(\alpha[i,s] + U(s,s')L_c^{(s)}[i]/2 + \beta[i,s'])}{\sum_{(s,s')\in P^1} \exp(\alpha[i,s] + U(s,s')L_c^{(s)}[i]/2 + \beta[i,s'])}, \quad (7)$$

where $L_{app}^{(p)}[i]$ is the APP LLR for the parity bit i, (s,s') is any valid state transition from state s to state s', U(s,s') is the systematic bit associated with the state transition, $P^0$ is the set of all state transitions generated by parity bit 0; $P^1$ is vice versa.

It is noted that the APP LLRs for parity bits are less reliable than information bits due to the following: i) parity bits are less protected in turbo codes; and ii) extrinsic information for parity bits may not be iterative exchanged.

FIG. 5 illustrates the improvements to a 3GPP decoder so that it outputs soft APP for both systematic and parity bits. First, the first decoder 1420 calculates a first APP LLR for the parity bits, $L_{app}^{(p,1)}[i]$, and the first extrinsic LLR for the systematic bits, $L_e^{(1)}[i]$. Likewise, the second decoder 1450 calculates a second APP LLR for the parity bits, $L_{app}^{(p,2)}[i]$, and the second extrinsic LLR for the systematic bits, $L_e^{(2)}[i]$ (step 1590). in FIG. 5, the first APP LLR $L_{app}^{(p,1)}[i]$ for the parity bit from the first decoder 1420 and the second APP LLR $L_{app}^{(p,2)}[i]$ for the parity bit from the second decoder 1450 are multiplexed in multiplexer 1480 with the APP LLR for the systematic bit $L_{app}^{(s)}[i]$ output from deinterleaver 1465 to produce a soft app for systematic and parity bits (step 1595).

The multiplexer 1480 recovers the APP LLRs for the whole code sequence from the outputs of the first decoder 1420 and the second decoder 1450. The whole code sequence includes the systematic bits, and the parity bits from the first constituent encoder 212a and the parity bits from the second constituent encoder 212b. The APP LLRs for the systematic bits are from the deinterleaver 1460. The APP LLRs for the parity bits from the first constituent encoder 212a are $L_{app}^{(p,1)}[i]$ from the first decoder 1420. The APP LLRs for the parity bits from the second constituent encoder 212b are $L_{app}^{(p,2)}[i]$ from the second decoder 1450.

Converting APPs to Soft Estimates of Data Symbols

Theoretically, the ideal capacity of a multiple-access channel can be achieved through an "onion peeling" process, where users are decoded in a successive manner, and the signal of successfully decoded users are subtracted from the waveform before decoding the next user. Therefore, a "cleaner" signal is available for the users yet to be decoded. Such procedure is typically referred to as successive interference cancellation (SIC). The multiple-access channel capacity is achieved under the assumption that the decoded signal is fully removed from the received waveform. In practical implementations, however, cancellation is not ideal and there will be residual interference remaining. Exactly how much interference could be removed depends on many factors, such as channel estimation quality, data decision quality, etc. An important measure called the interference cancellation efficiency β is used to further quantify the amount of interference cancelled.

In one example, interference cancellation efficiency may be defined as the ratio of canceled signal energy over the original signal energy. For simplicity, assuming a single path static channel with gain h, h·d denotes the noiseless signal that we want to reconstruct, ĥ·d̂ denotes the corresponding reconstructed signal, one can define the interference cancellation efficiency, β. E represents expectation. The interference cancellation efficiency can be written as $$\beta = 1 - \frac{E(|h \cdot d - \hat{h} \cdot \hat{d}|^2)}{|h|^2} \quad (8)$$

$$= 1 - E(|d - \hat{d}|^2) - \frac{E(|\hat{d} \cdot (h - \hat{h})|^2)}{|h|^2} - \text{cross\_term}$$

$$\approx 1 - E(|d - \hat{d}|^2) - E(|\hat{d}|^2) \cdot \frac{E(|h - \hat{h}|^2)}{|h|^2}$$

where h−ĥ represents the channel estimation error and d−d̂ represents the data symbol estimation error. Notice that in order to maximize cancellation efficiency, the mean squared error (MSE) of both the symbol decision and the channel estimation are minimized. Also notice that β indicates the quality of signal reconstruction where β=1 represents perfect cancellation when h·d is precisely reconstructed. A small positive β represents a signal that is not fully reconstructed and there is residual interference after cancellation. A negative β represents that we have falsely reconstructed signal, and instead of removing interference, we have added more interference to the waveform. In practice, signal reconstruction quality depends on both channel estimation and symbol decision quality.

Optimal Symbol Detector

Figure 6:
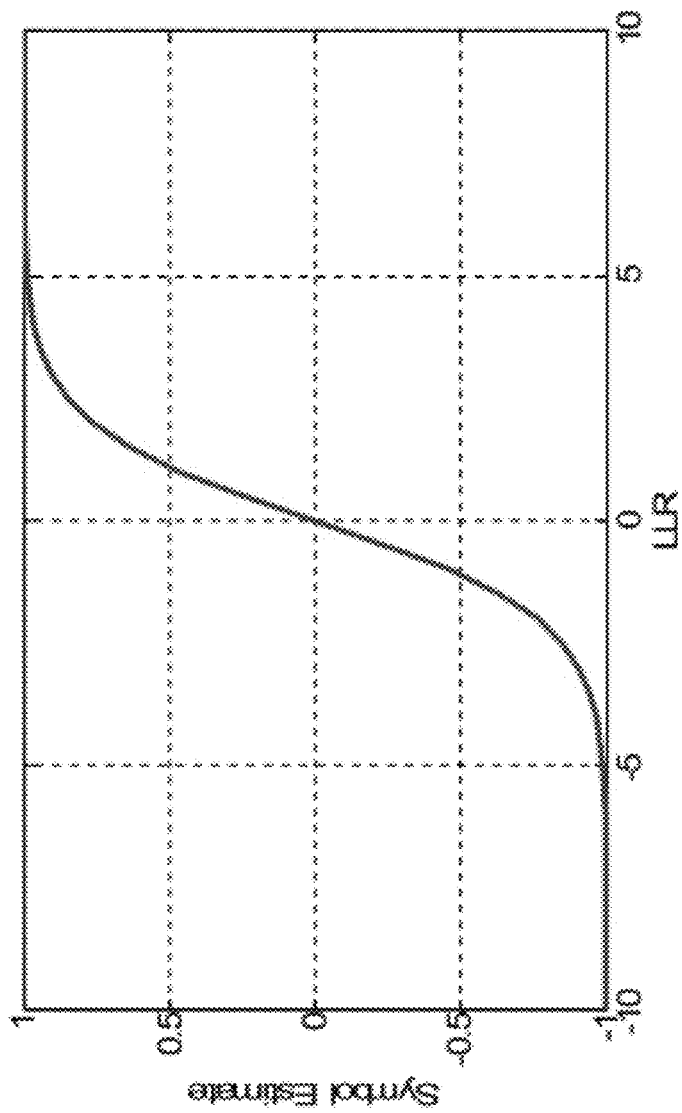
FIG. 6 illustrates how APP LRR is mapped to a soft symbol value using a tan h-function.

The symbol estimator 325 that achieves the highest cancellation efficiency is the MMSE estimator. Specifically, for noisy observation of binary sources, the MMSE estimate can be characterized as follows:

$$\hat{d}_{MMSE} = E[d \mid r] = \tanh\left(\frac{1}{2} \cdot L_{app}(d)\right) \quad (9)$$

where $L_{app}(d)$ is the APP LLR of corresponding coded symbol provided by the modified Turbo decoder 1417. FIG. 6 illustrates how the APP LLR is mapped to soft symbol value using a tan h-function in the symbol estimator 325.

Figure 7:
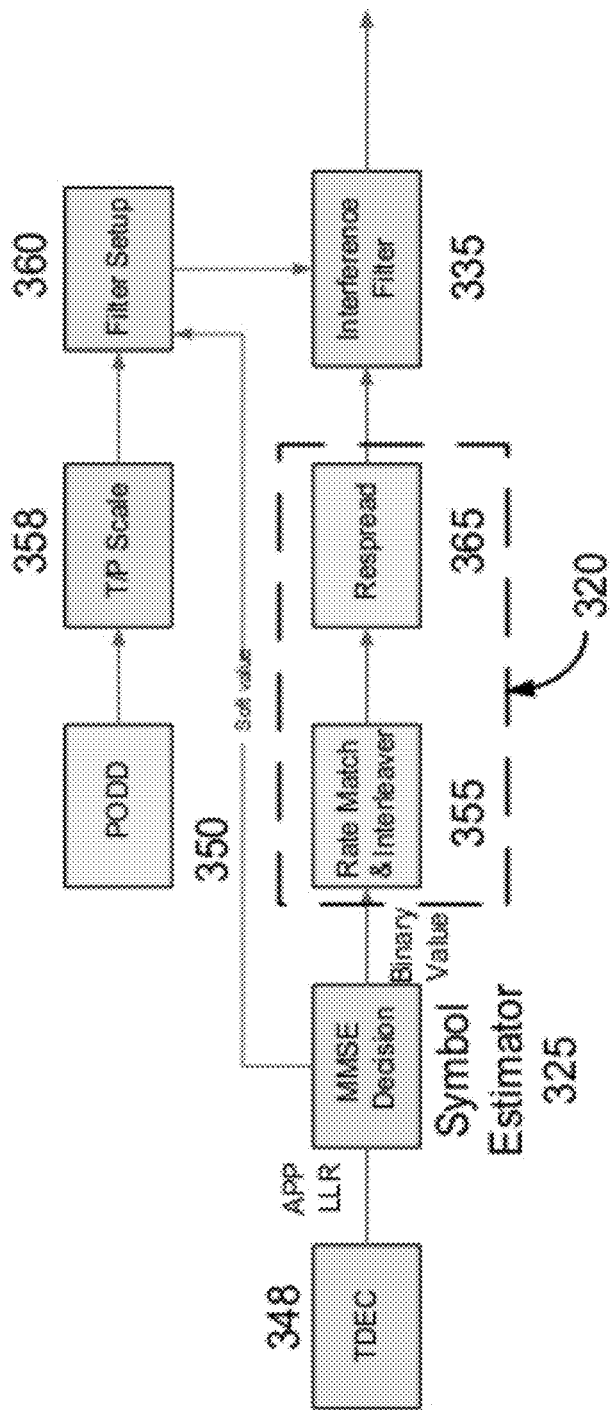
FIG. 7 is a block diagram of post-decoding interference cancellation using MMSE.

Since a soft symbol estimate is used, the following rate-matching, interleaving, re-spreading and interference filtering blocks may need to be modified to accept a soft value as input. In another example, a different architecture where those function blocks are unchanged (with binary input), and the reconstruction filter coefficients of the interference filter 335 are scaled by the corresponding soft symbol value used in the filter setup unit 360 is shown in FIG. 7. FIG. 7 outlines the block diagram of post-decoding soft IC using the latter architecture.

Figure 18:
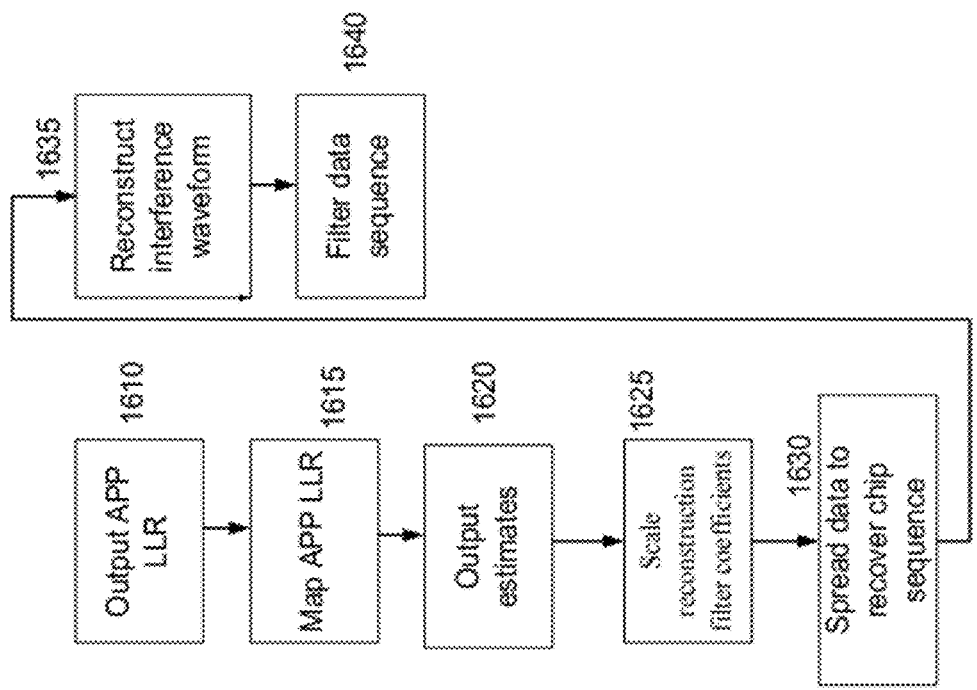
FIG. 18 is a flowchart of steps taken using the post-decoding interference cancellation apparatus of FIG. 7.

The turbo decoder (TDEC) 348 outputs an APP LLR to the symbol estimator 325 (see step 1610 of FIG. 18). The symbol estimator 325 in FIG. 7 maps the APP LLR to a soft symbol value using a tan h-function (step 1615). The soft symbol estimate falls between −1 to +1. As stated above, the soft symbol value is input to the filter setup unit 360. The pilot and overhead demodulation and decoder (PODD) 350 processes the Dedicated Physical Control Channel (DPCCH), the High Speed Dedicated Physical Control Channel (HS-DPCCH) and the Enhanced Dedicated Physical Control Channel (E-DPCCH) channels which carry pilot, and control information. The control information includes Transport Format Combination Indicator (TFCI) bits, Transmit Power Control (TPC) bits and Feedback Indicator (FBI) bits. The PODD 350 outputs timing offset, carrier phase and channel based estimates for each Rake finger to the traffic-to-pilot (T/P) scale unit 358 (step 1620). T/P represents the traffic-to-pilot ratio. The output of the T/P scale unit 358 is the channel estimation scaled (multiplied) by the square root of the T/P. The output of the T/P scale unit 358 is input to the filter setup unit 360. The filter setup unit 360 uses the output of the T/P scaler 358 and the corresponding soft symbol value to scale the reconstruction filter coefficients of the interference filter 335 (step 1625) as shown in FIG. 7.

The other output of the MMSE symbol estimator 325, a binary or hard output, is input to a rate match & interleaver unit 355. The output of the rate match & interleaver unit 355 is input to a respreader 365. The output of the respreader 365 is input to the interference filter 335. The rate match & interleaver unit 355 and the respreader 365 re-spreads the decoded data to recover the chip sequence (step 1630). The interference waveform is then reconstructed using the re-encoded chip sequence in the interference filtering unit 335 (step 1635). This interference waveform synthesis is implemented by first filtering the chip sequence, i.e., interference filtering (step 1640). The filtering reconstructs the received waveform samples. The apparatus in FIG. 7 is used as the interference cancelation block when decoding fails. When decoding fails, channel estimates for reconstruction are generated by the PODD 350 and not the DBCE 330. Channel estimates are incorporated in the filter setup block 360. The filtered waveform may be accumulated over multiple paths, where FIG. 7 illustrates reconstruction on a per path basis. Thus in this example, multi-path accumulation is not concatenated at the end.

It is noted that in the architecture of FIG. 7, filter setup may done every data symbol. For high data rate transmission with small spreading factors, this operation may be done quite frequently. Various reduced complexity algorithms may be used to approximate the above optimal method at the cost of some performance loss. A few such methods are disclosed below.

Reduced-Complexity Method 1: Hard Symbol Detector

Figure 8:
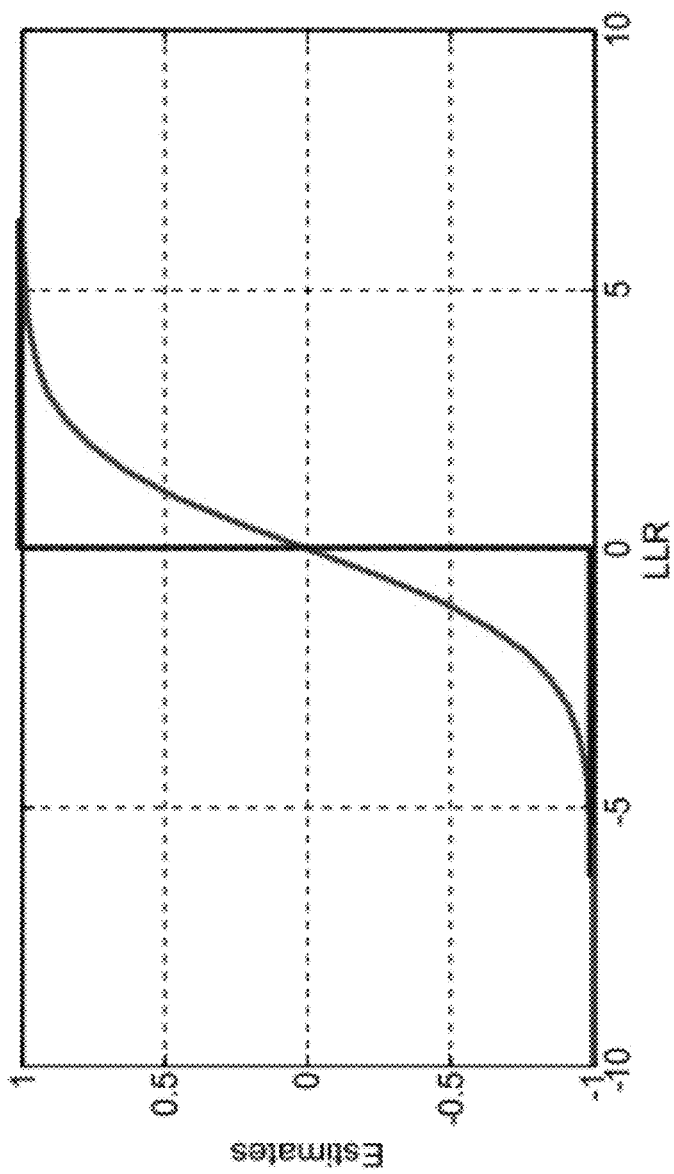
FIG. 8 illustrates a hard symbol detector approximating the tan h-function by a binary step function.
Figure 9:
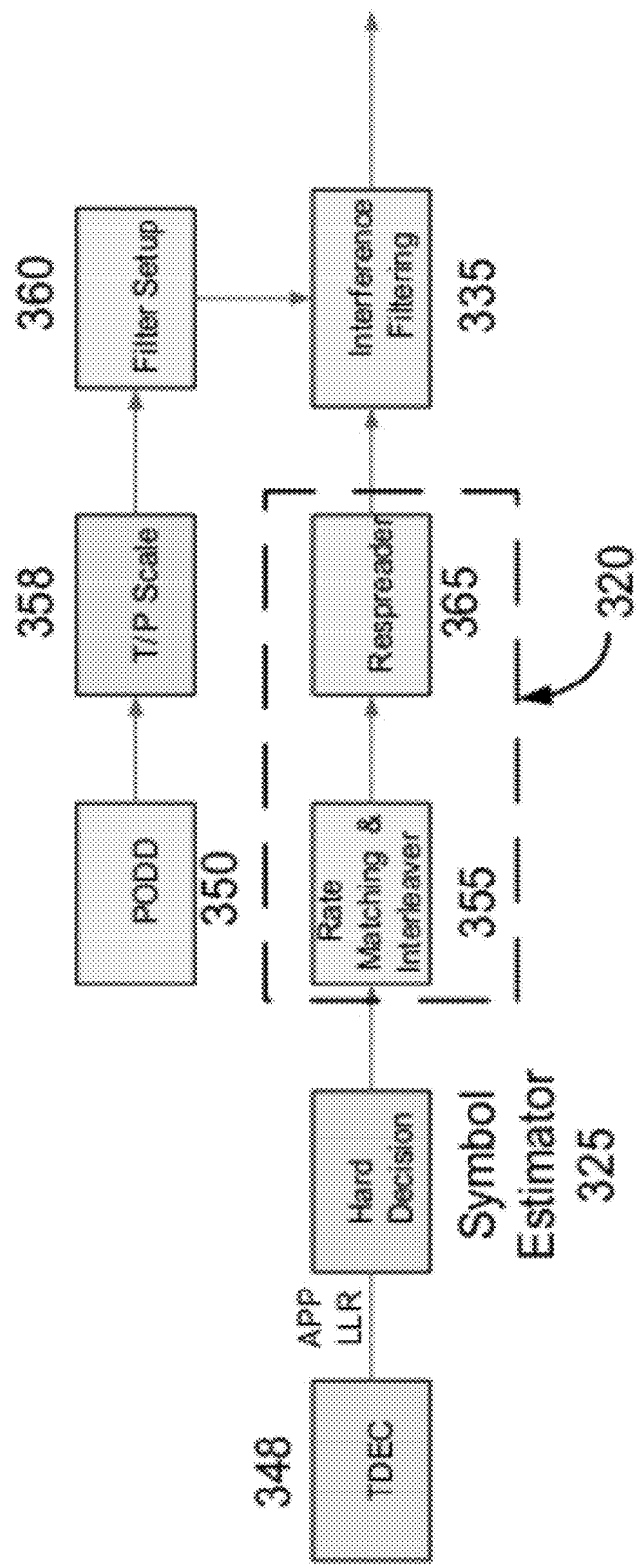
FIG. 9 is a block diagram of post-decoding interference cancellation using a hard symbol detector.

One simplification is to approximate the tan h-function by a binary step function illustrated in FIG. 8. This is equivalent to making a hard symbol detection using the APP LLR values. FIG. 9 illustrates an architecture using hard symbol decision.

It is noted that in the above implementation, symbol detection outputs a binary result. Therefore, all the following blocks including rate-matching, interleaving, re-spreading, and interference filtering will have a binary input. Also, the filter setup need not be updated at the data symbol rate. However, the binary step function approximation may introduce quantization error, especially at low reliability region when decoding fails.

Reduced-Complexity Method 2: Erasure Detector

Figure 10:
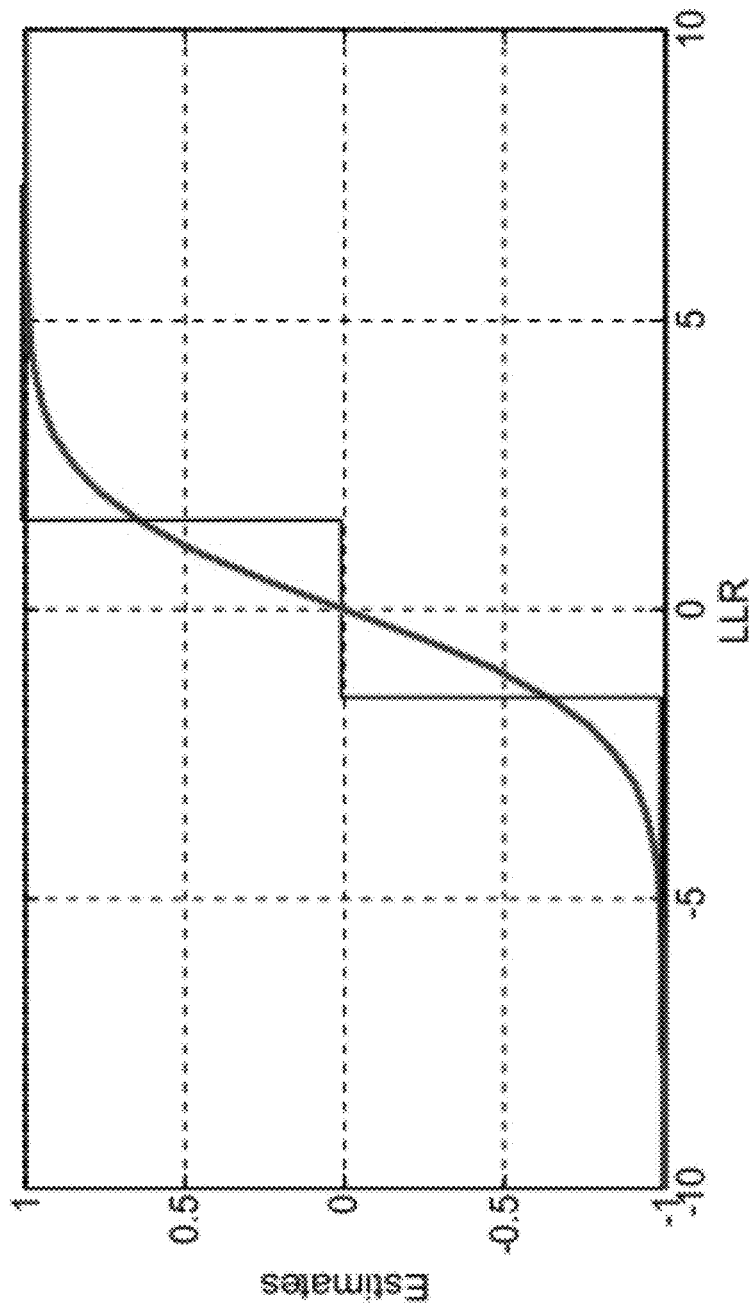
FIG. 10 illustrates a hard decision detector approximating the tan h-function using a ternary step function, instead of a binary step function.
Figure 11:
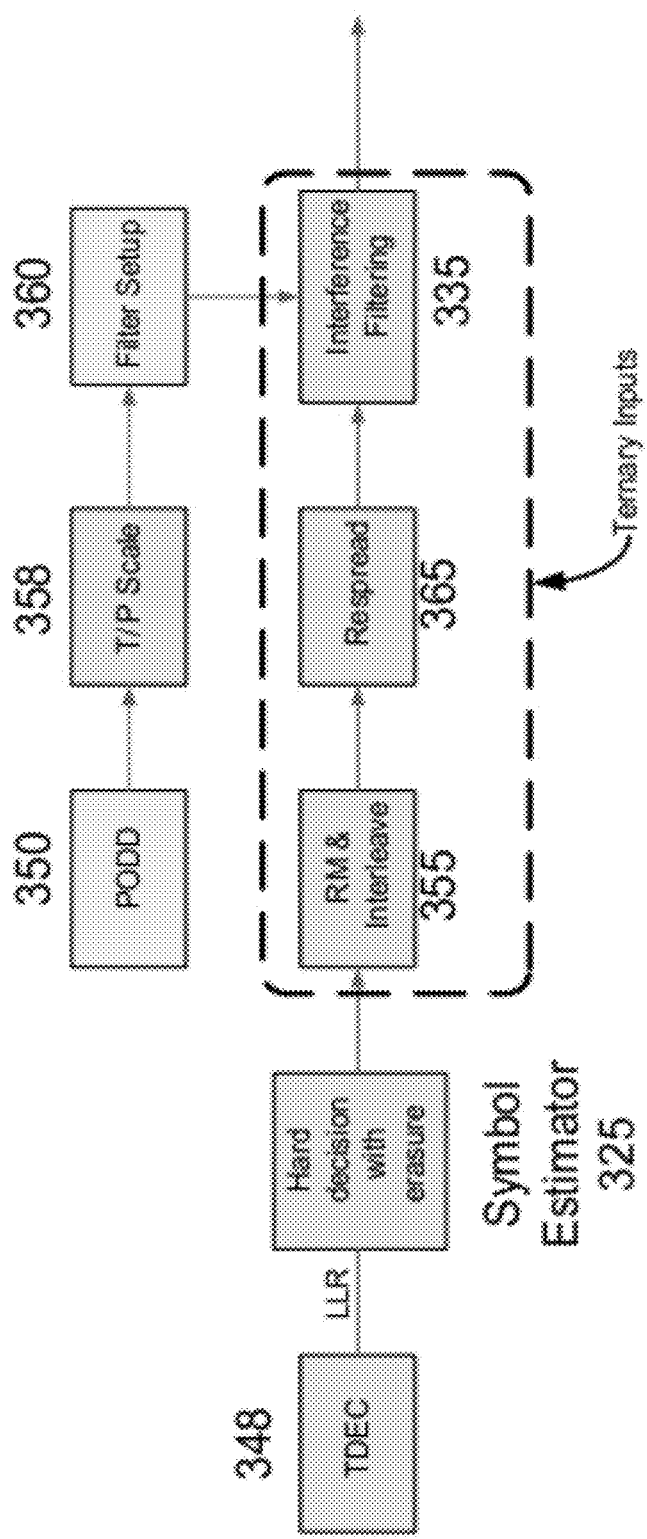
FIG. 11 is a block diagram of post-decoding interference cancellation using an erasure detector.

One way to improve the hard decision detector is to approximate the tan h-function using a ternary step function, instead of a binary step function, as illustrated by FIG. 10. This approximation is equivalent to introduce an erasure symbol detector, and avoiding making hard symbol decision for symbols with low reliability. An erasure threshold could be adjusted to achieve a minimal increase of a mean square estimation error. FIG. 11 illustrates a block diagram of this architecture. It is noted that the symbol estimator of FIG. 11 may output ternary estimates, therefore rate-matching, interleaving, re-spreading and interference filtering blocks are modified to take ternary input instead of binary input. Again, the interference filter setup need not be updated at the data symbol rate.

Reduced-complexity Method 3: Average Reliability

Figure 12:
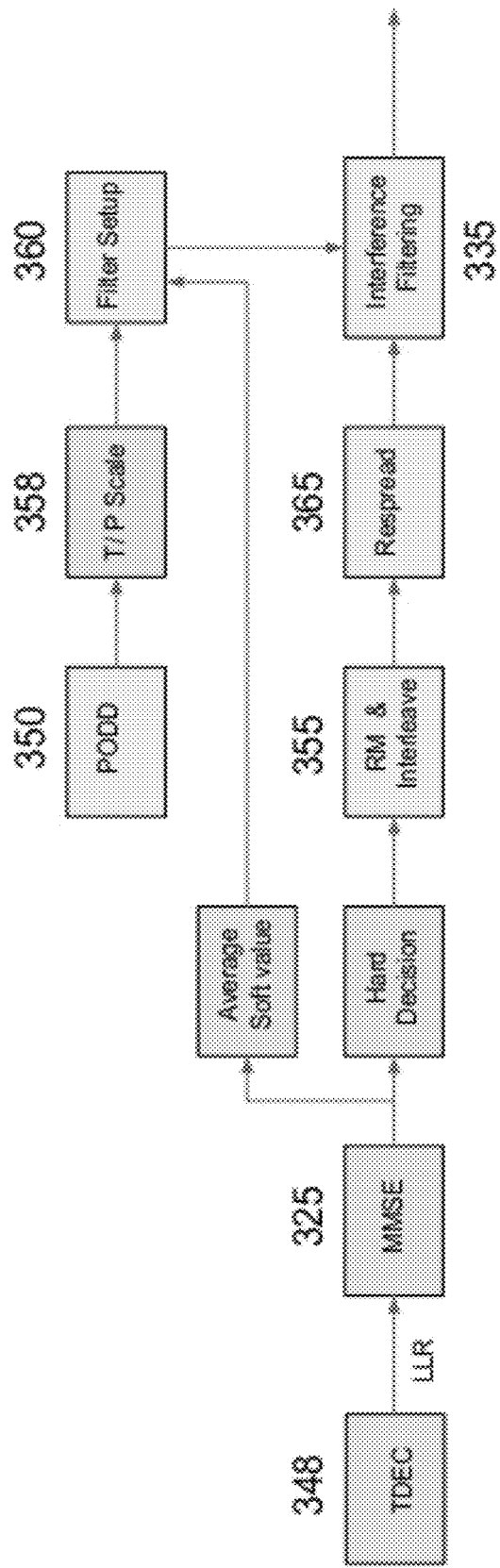
FIG. 12 is a block diagram of post-decoding interference cancellation using average reliability.

The interference filter coefficients of the optimal MMSE symbol estimator may be scaled by the reliability (LLR value) every data symbol, which may be costly when the spreading factor is small. One approach to approximate this optimal method is to scale the filter coefficients by the "average reliability" over a block of symbols, instead of the reliability of each symbol individually. Thereby, the filter setup could be done at much lower rate. Such architecture is illustrated in FIG. 12. It is noted that the symbol estimator may output binary estimates in this case, therefore, rate-matching, interleaving, re-spreading, and interference filtering blocks need not change. Filter setup may be updated once per block of symbols. The average soft value is used to scale the filter coefficient. In one example, this scaling can either happen in the filter setup block or happen together with the T/P scaling block.

Interaction with H-ARQ Operation

The reconstructed signal output by the interference filtering block 335 may be removed from the original waveform buffer. Such a function is denoted as interference subtraction which is performed by an interference subtraction module 340. When a packet transmission spans several transmission intervals (TTI), such as in HARQ operation in HSUPA, the implementation of interference subtraction can vary for different trade-offs between cancellation efficiency and processing complexity.

An Optimal Method

In one example, a method and apparatus that achieves optimal cancellation efficiency cleans the original waveform using the latest reconstructed signal after each decoding attempt. This method assumes the reliability of turbo decoding results monotonically improve with number of transmissions (or HARQ number). After decoding of each retransmission, the present method reconstructs the signal of all the previous HARQ processes and cancels the signal again. Also, during decoding a re-transmitted packet, the Traffic Data Demodulator (TDD) 305 re-demodulates the data in previous HARQ transmissions before HARQ combining, in order to fully benefit from the cancellation of other packets. In order to achieve this, the latest reconstructed signal of each packet that has not yet been successfully decoded, is stored. However, the LLR values from previous HARQ processes no longer need to be stored. In addition, the present method also stores a waveform of length equal to the maximal allowed overall transmission delay. In HSUPA, this is roughly 50 ms of data.

Figure 13:
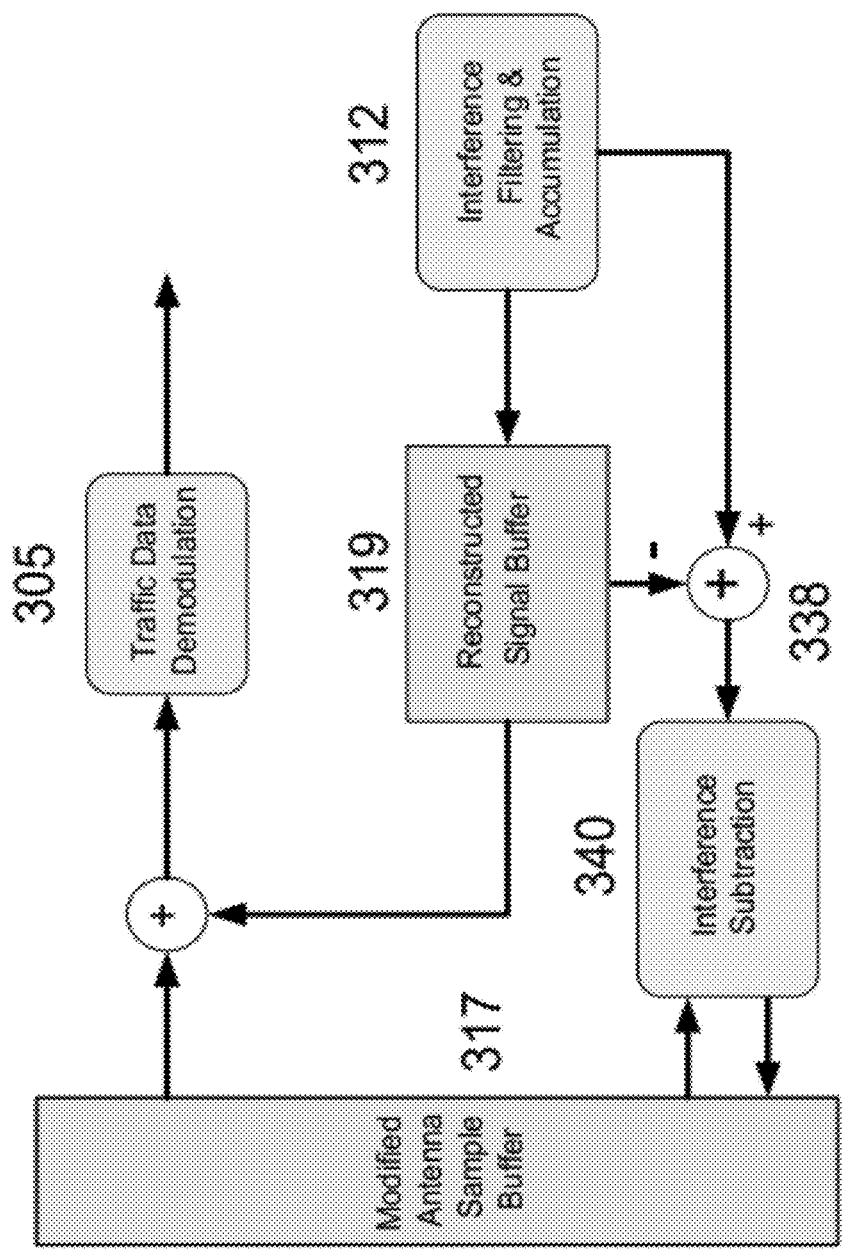
FIG. 13 illustrates optimal soft interference cancellation where multiple H-ARQ transmissions per user are canceled.
Figure 19:
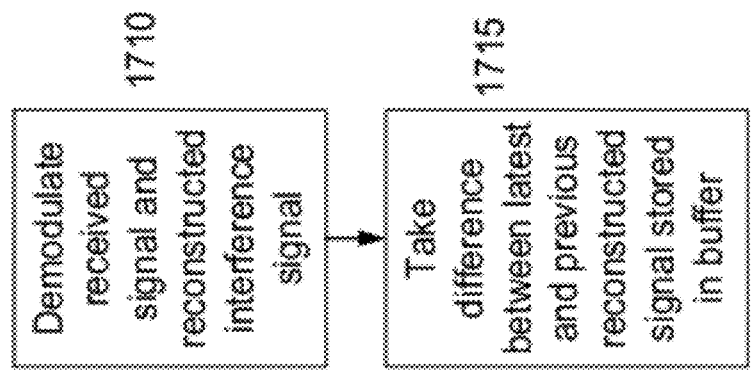
FIG. 19 is a flowchart of steps taken using the optimal soft interference cancellation apparatus of FIG. 13 where multiple H-ARQ transmissions per user are canceled.

FIG. 13 illustrates an implementation of optimal soft interference cancellation where multiple H-ARQ transmissions per user are canceled. Compared to FIG. 2, two new logic blocks are added, a reconstruction signal buffer 319 and a summer 338. The function of both will be explained below. After each Turbo decoding, signals are reconstructed for each previous re-transmission. As seen in FIG. 13, the traffic data demodulator (TDD) unit 305 performs demodulation on a received signal from the modified antenna sample buffer 317 and a reconstructed interference signal which was stored in a reconstructed signal buffer 319 (see step 1710 of FIG. 19). As stated above with respect to FIG. 2, the interference signal is reconstructed in the interference filtering and accumulation unit 335 using the new channel estimates and the re-encoded chip sequence. In a summer 338, the difference between the latest reconstructed signal and the previous reconstructed signal are computed and is output to the interference subtraction unit 340 (step 1715). In the interference subtraction unit 340 the difference between the latest reconstructed signal and the previous reconstructed signal is subtracted from the samples in the modified antenna sample buffer 317.

Reduced Complexity Method

As mentioned in the previous section, the optimal method uses a large amount of memory storage. The reduced complexity method and apparatus, keeps track of less information than the optimal method and apparatus. It keeps track of i) the reconstructed signal for all previous HARQs of all the packets that fail to decode; and ii) it has a large modified antenna sample buffer that stores the waveform for the maximal possible number of re-transmissions.

In addition, the reduced complexity method computes the iii) the difference between the latest and previous reconstructed signals for all the HARQ processes; and iv) re-demodulates data in previous transmissions before HARQ combining. This leads to a large amount of computation.

Figure 14:
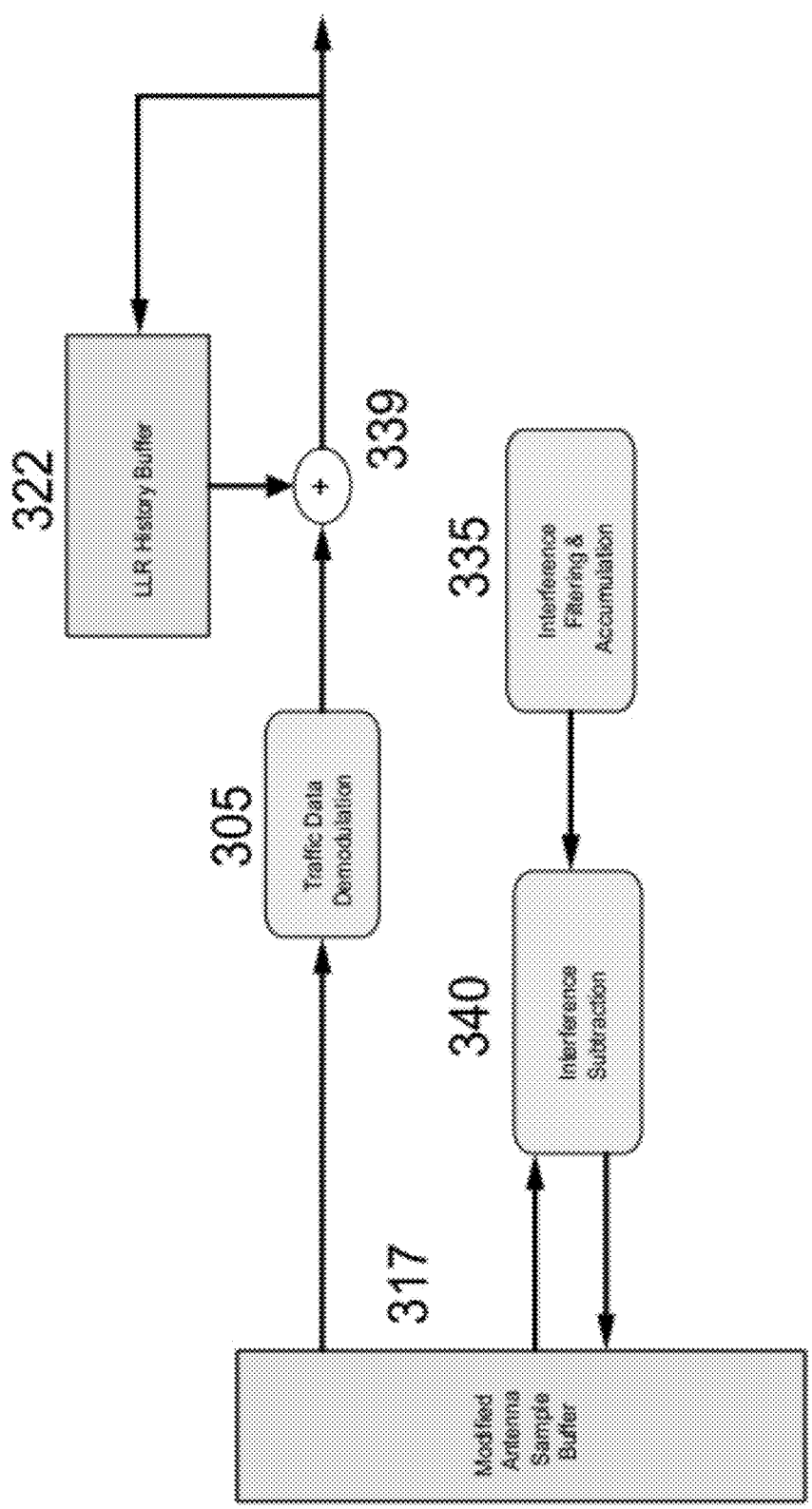
FIG. 14 illustrates reduced complexity soft interference cancellation where the latest H-ARQ transmission is canceled.

One suboptimal strategy is to cancel only the most recent retransmission using the latest reconstructed signal. This approach eliminates the need to store previous reconstructed signals and waveforms that are more than one HARQ period earlier. It also eliminates the need to re-demodulate data of previous re-transmissions. Such a method is illustrated in FIG. 14. FIG. 14 illustrates a reduced complexity soft interference cancellation where the latest H-ARQ transmission is canceled. Compared to FIG. 2, two new logic blocks are added, a LLR history buffer 319 and a summer 339. The function of both will be explained below. As seen in FIG. 14, the traffic data demodulator (TDD) unit 305 demodulates a received signal from the modified antenna sample buffer 317. The demodulated signal is output to the summer 339. The LLR history buffer 322 stores relevant LLR information. The input to the LLR history buffer 322 is from the output of the adder 339. The LLR history buffer 322 stores the channel LLRs derived from all previous H-ARQ transmissions. The LLRs demodulated from current H-ARQ transmissions are combined with the LLRs stored in the LLR history buffer 322. The combined LLRs are sent to the turbo decoder 1417 and the LLR history buffer 322 is updated by the combined LLRs. The output of the LLR history buffer 322 is also fed to the summer 339. As stated above with respect to FIG. 2, the interference signal is reconstructed in the interference filtering and accumulation unit 335 using the new channel estimates and the re-encoded chip sequence. In the interference subtraction unit 340 the reconstructed interference signal is subtracted from the samples in the modified antenna sample buffer 337.

An attractive feature of the present method and apparatus is that it can be easily accommodated with minor modifications to existing architectures of hard interference cancellation with a significant reduction in memory use. Post decoding soft interference cancellation along with hard interference cancellation leads to non-trivial capacity benefits over using hard interference cancellation alone.

Complexity Reduction Methods

The following features may reduce complexity while retaining similar performance:

Limiting MASB to 26 msec worth of samples.

Opportunistic Cancellation—1) Advanced TIC scheduler and 2) Flexible hardware to allow SIC/GIC/PIC software control, where SIC stands for successive interference cancellation. GIC stands for group interference cancellation. PIC stands for Parallel interference cancellation.

Use of external memory (e.g., QDR-11 for MASB).

Complexity optimized finger combining and cancellation thresholds.

Cancelling the last 10 msec worth of samples—1) last two transmissions of 2 msec E-DCH; 2) last transmission of 10 msec E-DCH; and 3) last 10 msec of R99 users.

Not attempting to demodulate or decode the $1^{st}$ transmission of 2 msec E-DCH.

Do not cancel SID and NULL R99 voice frames. SID stands for silence insertion description.

Partial cancellation under non-optimized set points.

Cancel softer handover users in their serving cell only.

Cancellation without DBCE.

Communication systems may use a single carrier frequency or multiple carrier frequencies. Each link may incorporate a different number of carrier frequencies. Furthermore, an access terminal 10 may be any data device that communicates through a wireless channel or through a wired channel, for example using fiber optic or coaxial cables. An access terminal 10 may be any of a number of types of devices including but not limited to PC card, compact flash, external or internal modem, or wireless or wireline phone. The access terminal 10 is also known as user equipment (UE), a remote station, a mobile station or a subscriber station. Also, the UE 10 may be mobile or stationary.

User equipment 10 that has established an active traffic channel connection with one or more Node Bs 20 is called active user equipment 10, and is said to be in a traffic state. User equipment 10 that is in the process of establishing an active traffic channel connection with one or more Node Bs 20 is said to be in a connection setup state. User equipment 10 may be any data device that communicates through a wireless channel or through a wired channel, for example using fiber optic or coaxial cables. The communication link through which the user equipment 10 sends signals to the Node B 20 is called a uplink. The communication link through which an NodeB 20 sends signals to a user equipment 10 is called a downlink.

Figure 20:
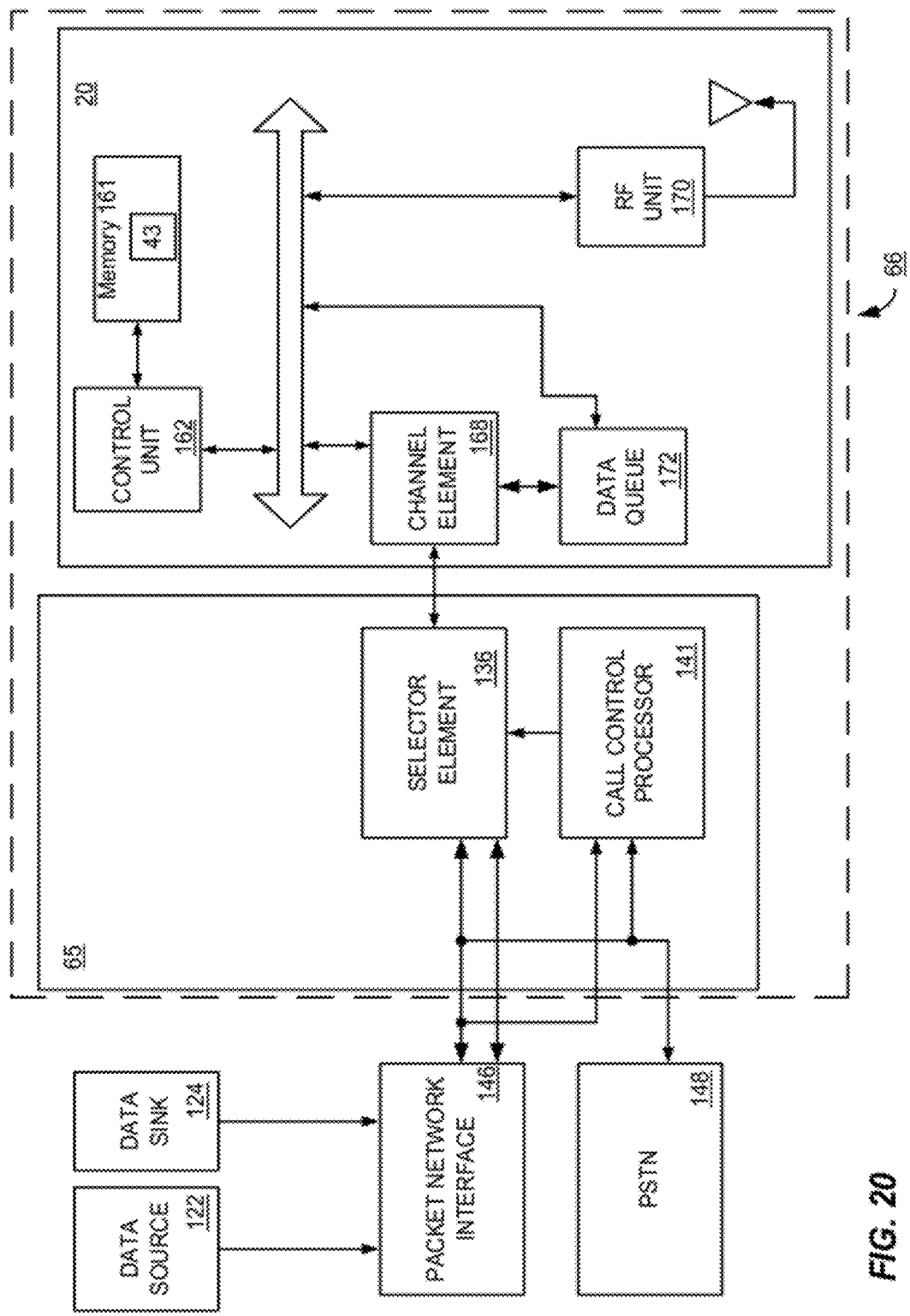
FIG. 20 is detailed herein below, wherein specifically, a Node B 20 and radio network controller 65 interface with a packet network interface 146; is a portion of a communication system, including a radio network controller 65 and a node B 20.

FIG. 20 is detailed herein below, wherein specifically, a Node B 20 and radio network controller 65 interface with a packet network interface 146. The Node B 20 and radio network controller 65 may be part of a radio network server (RNS) 66, shown in FIG. 1 and in FIG. 20 as a dotted line surrounding one or more Node Bs 20 and the radio network controller 65. The associated quantity of data to be transmitted is retrieved from a data queue 172 in the Node B 20 and provided to the channel element 168 for transmission to the remote station 10 associated with the data queue 172.

Radio network controller 65 interfaces with packet network interface 146, Public Switched Telephone Network (PSTN) 148, and all Node Bs 20 in the communication system 100 (only one Node B 20 is shown in FIG. 20 for simplicity). Radio network controller 65 coordinates the communication between remote stations 10 in the communication system and other users connected to packet network interface 146 and PSTN 148. PSTN 148 interfaces with users through a standard telephone network (not shown in FIG. 20).

Radio network controller 65 contains many selector elements 136, although only one is shown in FIG. 20 for simplicity. Each selector element 136 is assigned to control communication between one or more Node B's 20 and one remote station 10 (not shown). If selector element 136 has not been assigned to a given user equipment 10, call control processor 141 is informed of the need to page the remote station. Call control processor 141 then directs Node B 20 to page the remote station 10.

Data source 122 contains a quantity of data, which is to be transmitted to a given remote station 10. Data source 122 provides the data to packet network interface 146. Packet network interface 146 receives the data and routes the data to the selector element 136. Selector element 136 then transmits the data to Node B 20 in communication with the target remote station 10. In the exemplary embodiment, each Node B 20 maintains a data queue 172, which stores the data to be transmitted to the remote station 10.

For each data packet, channel element 168 inserts the necessary control fields. In the exemplary embodiment, channel element 168 performs a cyclic redundancy check, CRC, encoding of the data packet and control fields and inserts a set of code tail bits. The data packet, control fields, CRC parity bits, and code tail bits comprise a formatted packet. In the exemplary embodiment, channel element 168 then encodes the formatted packet and interleaves (or reorders) the symbols within the encoded packet. In the exemplary embodiment, the interleaved packet is covered with a Walsh code, and spread with the short PNI and PNQ codes. The spread data is provided to RF unit 170 which quadrature modulates, filters, and amplifies the signal. The downlink signal is transmitted over the air through an antenna to the downlink.

At the user equipment 10, the downlink signal is received by an antenna and routed to a receiver. The receiver filters, amplifies, quadrature demodulates, and quantizes the signal. The digitized signal is provided to a demodulator (DEMOD) where it is despread with the short PNI and PNQ codes and decovered with the Walsh cover. The demodulated data is provided to a decoder which performs the inverse of the signal processing functions done at Node B 20, specifically the de-interleaving, decoding, and CRC check functions. The decoded data is provided to a data sink.

Figure 21:
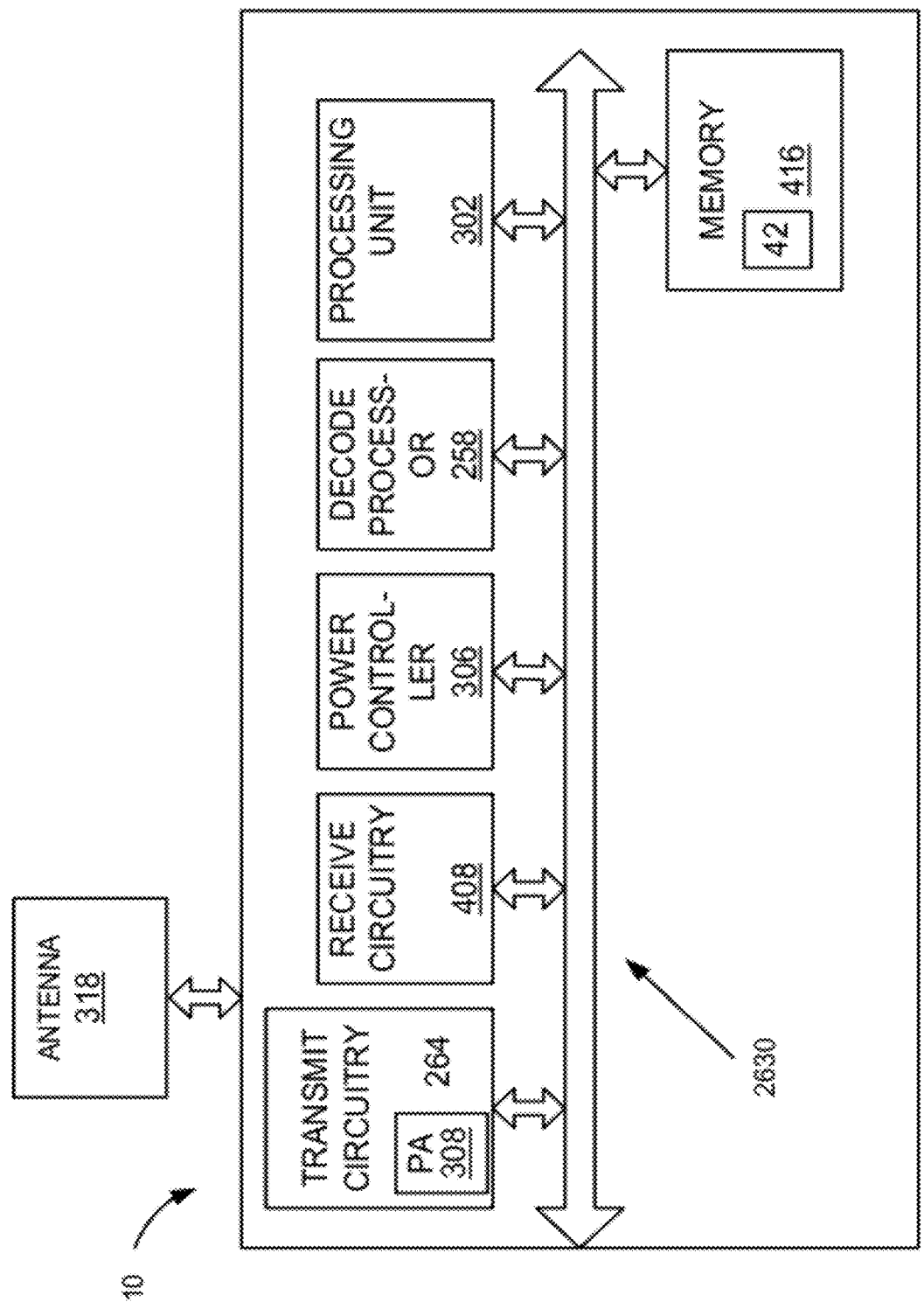
FIG. 21 illustrates an embodiment of user equipment (UE).

FIG. 21 illustrates an embodiment of a user equipment (UE) 10 in which the UE 10 includes transmit circuitry 264 (including PA 308), receive circuitry 408, throttle control 306, decode process unit 258, processing unit 302, and memory 416.

The processing unit 302 controls operation of the UE 10. The processing unit 302 may also be referred to as a CPU. Memory 416, which may include both read-only memory (ROM) and random access memory (RAM), provides instructions and data to the processing unit 302. A portion of the memory 416 may also include non-volatile random access memory (NVRAM).

The UE 10, which may be embodied in a wireless communication device such as a cellular telephone, may also include a housing that contains a transmit circuitry 264 and a receive circuitry 408 to allow transmission and reception of data, such as audio communications, between the UE 10 and a remote location. The transmit circuitry 264 and receive circuitry 408 may be coupled to an antenna 318.

The various components of the UE 10 are coupled together by a bus system 2630 which may include a power bus, a control signal bus, and a status signal bus in addition to a data bus. However, for the sake of clarity, the various busses are illustrated in FIG. 21 as the bus system 2630. The UE 10 may also include a processing unit 302 for use in processing signals. Also shown are a power controller 306, a decode processor 258, and a power amplifier 308.

The steps of the methods discussed may be stored as instructions in the form of software or firmware 43 located in memory 161 in the Node B 20. These instructions may be executed by the control unit 162 of the Node B 20 in FIG. 20.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

Therefore, the present invention is not to be limited except in accordance with the following claims.

The invention claimed is:

1. A method of canceling interference, comprising:
   demodulating a data packet;
   decoding the data packet;
   generating updated a posteriori probabilities for systematic and parity bits;
   mapping said a posteriori probabilities to symbols;
   re-encoding said data packet using said symbols, whereby a chip sequence is produced;
   filtering said chip sequence;
   storing a latest reconstructed signal of each packet that has not yet been successfully decoded;
   computing a difference between the latest reconstructed signal and a previously reconstructed signal; and subtracting the difference between the latest reconstructed signal and the previously reconstructed signal from a sample input signal,
wherein the demodulating comprises demodulating a received sample input signal and the latest reconstructed interference signal.

2. The method according to claim 1, wherein said a posteriori probabilities are mapped to output a soft decision for said symbols, defined as soft symbols, using minimum mean-squared error criteria.

3. The method according to claim 2, wherein said soft symbols are averaged.

4. The method according to claim 1, wherein said soft symbols are quantized and said a posteriori probabilities are mapped to output a hard decision for said symbols using a binary step function to approximate a tan h-function.

5. The method according to claim 1, wherein said a posteriori probabilities are mapped to output a hard decision for said symbols using a ternary step function to approximate a tan h-function.

6. The method according to claim 1, further comprising:
storing relevant channel estimate information; and
producing new channel estimates.

7. The method according to claim 6, further comprising:
multiplying said filtered chip sequence with at least one of said channel estimates;
accumulating multiple said filtered chip sequences together to reconstruct an interference waveform; and
subtracting said interference waveform from received input samples.

8. The method according to claim 1, further comprising:
multiplying said filtered chip sequence with a channel estimate;
accumulating multiple said filtered chip sequences together to reconstruct an interference waveform; and
subtracting said interference waveform from received input samples.

9. The method according to claim 8, wherein said interference waveform is a composite interference waveform.

10. An apparatus to post-decode soft interference cancellation, comprising:
a traffic data demodulator unit configured to demodulate a received signal;
a turbo decoder configured to generate a posteriori probabilities for bits;
a processor configured to determine whether a data packet was successfully decoded;
a symbol estimator operably connected to said turbo decoder and configured to map said a posteriori probabilities to symbols;
a data re-encoder operably connected to said symbol estimator and configured to re-encode the decoded data to recover a chip sequence;
a traffic interference filtering and accumulation unit operably connected to said data re-encoder and configured to filter the chip sequence and reconstruct an interference waveform using the re-encoded chip sequence,
wherein the apparatus is configured to:
store a latest reconstructed signal of each packet that has not yet been successfully decoded;
compute a difference between the latest reconstructed signal and a previously reconstructed signal; and
subtract the difference between the latest reconstructed signal and the previously reconstructed signal from a sample input signal,
wherein the traffic data demodulator unit is further configured to demodulate a received sample input signal and the latest reconstructed interference signal.

11. The apparatus according to claim 10, further comprising:
a data-based channel estimator operably connected to said data re-encoder and configured to produce new channel estimates; and
a pilot demodulator history buffer operably connected to said data-based channel estimator unit and configured to store relevant channel estimate information including channel estimates.

12. The apparatus according to claim 11, further comprising:
a sample input buffer configured to receive input samples;
wherein the interference subtraction unit is further configured to subtract the interference waveform from the received input samples; and
the interference filtering and accumulation unit is further configured to multiply said filtered chip sequence with a channel estimate and accumulate multiple said filtered chip sequences together to reconstruct said interference waveform.

13. The apparatus according to claim 11, further comprising:
a sample input buffer configured to receive input samples; and
the interference subtraction unit is further configured to subtract the interference waveform from the received input samples; and
the interference filtering and accumulation unit is further configured to multiply said filtered chip sequence with at least one of said channel estimates and accumulate multiple said filtered chip sequences together to reconstruct said interference waveform.

14. The apparatus according to claim 10, wherein said a posteriori probabilities are mapped to output a soft decision for said symbols, defining soft symbols, using minimum mean-squared error criteria, and wherein said a posteriori probabilities are generated for systematic and parity bits.

15. The apparatus according to claim 14, wherein said soft symbols are averaged.

16. The apparatus according to claim 10, wherein said symbols are quantized and said a posteriori probabilities are mapped to output a hard decision for said symbols using a binary step function to approximate a tan h-function.

17. The apparatus according to claim 10, wherein said a posteriori probabilities are mapped to output a hard decision for said symbols using a ternary step function to approximate a tan h-function.

18. The apparatus according to claim 10, wherein said interference waveform is a composite interference waveform.

19. The apparatus according to claim 10, wherein the apparatus is configured to use a reconstructed signal buffer for storing the latest constructed signal of each packet that has not yet been successfully decode, the reconstructed signal buffer having an input operably connected to an output of said interference filtering and accumulation unit;
a summer, having a first input operably connected to an output of said reconstructed signal buffer, a second input operably connected to an output of said interference filtering and accumulation unit and at least one output operably connected to an input of said interference subtraction unit, and
the difference is subtracted from samples in a modified antenna sample buffer in an interference subtraction unit, and said traffic data demodulator unit demodulates a received signal from the sample input buffer and said reconstructed interference signal.

* * * * *